United States Patent [19]
Guha

[11] Patent Number: 5,699,369
[45] Date of Patent: Dec. 16, 1997

[54] ADAPTIVE FORWARD ERROR CORRECTION SYSTEM AND METHOD

[75] Inventor: Aloke Guha, Minneapolis, Minn.

[73] Assignee: Network Systems Corporation, Minneapolis, Minn.

[21] Appl. No.: 413,121

[22] Filed: Mar. 29, 1995

[51] Int. Cl.$^6$ ............................................. H03M 13/00
[52] U.S. Cl. ............................................. 371/41
[58] Field of Search ............................................. 371/41

[56] References Cited

U.S. PATENT DOCUMENTS 5,432,787  7/1995  Chethik ............................................. 370/79

OTHER PUBLICATIONS

Bhargava et al., "Performance Comparison of Error Control Schemes in High-Speed Computer Communication Networks", IEEE Jour. on Selected Areas in Communications, vol. 6, No. 9, pp. 1565–1575, Dec. 1988.

Cidon et al., "Analysis of Packet Loss Processes in High-Speed Networks", IEEE Trans. on Information Theory, vol. 39, No. 1, pp. 98–108, Jan. 1990.

Shacham et al., "Packet Recovery in High-Speed Networks Using Coding and Buffer Management", INFOCOM '90, pp. 124–131, May 1990.

Ohta et al., "a Cell Loss Recovery Method Using FEC in ATM Networks", IEEE Jour. on Selected Areas in Communications, vol. 9, No. 9, pp. 1471–1483, Dec. 1991.

Zhang, "Statistics of Cell Loss and 1st Application for Forward Error Recovery in ATM Network", ICC '92 pp. 694–698, 1992.

Biersack, "Performance Evaluation of Forward Error Correction in an ATM Environment", IEEE Jour. on Selected Areas in Communications, vol. 11, No. 4, pp. 631–640, May 1993.

Oguz et al., "A Simulation Study of Two-Level Forward Error Correction for Lost Packet Recovery in B-ISDN/ATM", IEEE Int'l. Conf. on Communications '93, pp. 1843–1845, May 1993.

Dholakia et al., "A Lost Packet Recovery Technique Using Convolutional Coding in High Speed Networks", MILCOM '93, pp. 318–322, Jul. 1993.

McDysan et al., "ATM Theory and Application", McGraw-Hill, Inc., Table of Contents. 1994.

Kawahara et al., "Forward Error Correction in ATM Networks: An Analysis of Cell Loss Distribution in a Block", INFOCOM '94, 1150–1159, 1994.

Riley et al., "Adapting MPEG Video Traffic to Avoid Network Congestion", Telecommunications, 1994 IEE Conf., pp. 105–108, Mar. 1995.

McDysan et al., ATM Theory and Application, McGraw–Hill Inc., table of contents and pp. 196–250, Dec. 1994.

(List continued on next page.)

*Primary Examiner*—Stephen M. Baker
*Attorney, Agent, or Firm*—Merchant, Gould, Smith, Edell, Welter & Schmidt, P.A.

[57] ABSTRACT

An adaptive forward error correction (FEC) protocol for use in an asynchronous transfer mode (ATM) communication network is provided. Whether a feasibility condition is met indicating that FEC can compensate for an expected number of burst errors in a FEC encoded payload is determined. Subsequently, FEC encoding is performed on protocol data units (PDUs) within a payload to form the FEC encoded payload only when the feasibility condition is met. Adaptive FEC sending and receiving units which effectuate the adaptive FEC protocol are provided. In addition, an alternative adaptive FEC protocol is provided which determines a feasibility condition based on whether a PDU loss probability between connection service application points for a payload is greater than an effective PDU loss probability for the payload with associated FEC PDUs at a given load on the communication network. Also, a method for determining an overhead parameter for adaptive FEC in a communication network is provided.

46 Claims, 6 Drawing Sheets

OTHER PUBLICATIONS

E. Ayanoglu, R.D. Gitlin, and N.C. Oguz, "Performance Improvement in Broadband Networks Using Forward Error Correction", Journal of High Speed Networks, vol. 2, 1993, pp. 287–304.

Motorola University Press, The Basics Book of CSI and Network Management, Sep. 1992.

A.J. McAuley, "Reliable Broadband Communications Using A Burst Erasure Correcting Code,: Proc. ACM SIGCOMM '90", Philadelphia, PA, Sep. 1990, pp. 287–306.

S. Lin and D.J. Costello, *Error Control Coding: Fundamental and Applications,* Prentice Hall, Inc., New Jersey, 1983.

| Layer Name | | Functions Performed |
|---|---|---|
| Higher Layers | | Higher Layer Functions |
| A A L | Convergence Sublayer (CS) | Common Part (CP) |
| | | Service Specific (SS) |
| | SAR Sublayer | Segmentation And Reassembly |
| ATM | | Generic Flow Control<br>Call Header Generation/Extraction<br>Cell VCI/VPI Translation<br>Cell Multiplexing/Demultiplexing |
| P h y s i c a l | Transmission Convergence (TC) Sublayer | Cell Rate Decoupling<br>Cell Delineation<br>Transmission Frame Adaption<br>Transmission Frame Generation/Recovery |
| | Physical Medium (PM) | Bit Timing<br>Physical Medium |

(Layer Management)

FIG. 1
-Prior Art-

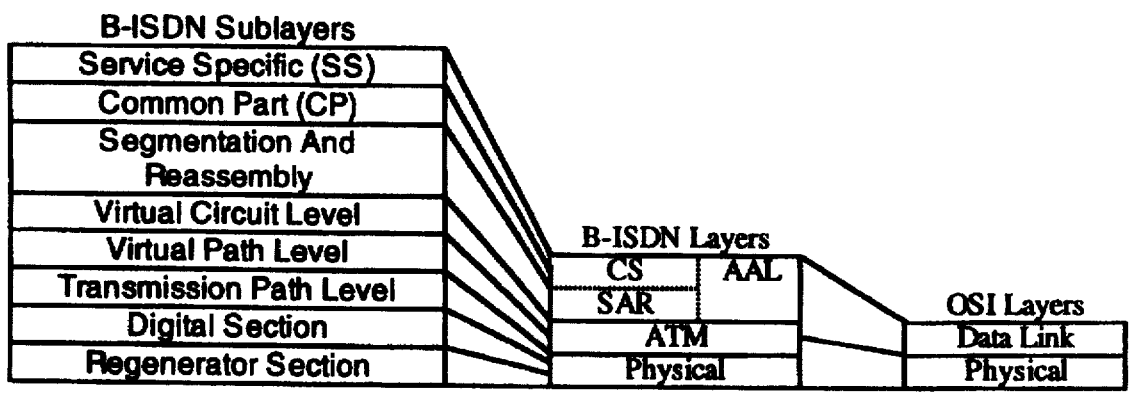

FIG. 2
-Prior Art-

ADAPTIVE FORWARD ERROR CORRECTION SYSTEM AND METHOD

FIELD OF THE INVENTION

The present invention relates to adaptive forward error correction and more particularly to its use in an asynchronous transfer mode communication network.

BACKGROUND OF THE INVENTION

Asynchronous Transfer Mode (ATM) is a cell-based switching and multiplexing technology designed to be a general-purpose, connection-oriented transfer mode for a wide range of services. ATM is also being used on local area networks (LANs) and private networks.

ATM handles both connection-oriented traffic and connectionless traffic through the use of adaptation layers. ATM virtual connections may operate at either a Constant Bit Rate (CBR) or a Variable Bit Rate (VBR). Each ATM cell sent into the network contains addressing information that establishes a virtual connection from origination to destination. All cells are then transferred, in sequence, over this virtual connection. ATM provides either Permanent or Switched Virtual Circuits (PVCs or SVCs). ATM is asynchronous because the transmitted cells need not be periodic as time slots of data are in Synchronous Transfer Mode (STM).

ATM offers the potential to standardize on one network architecture defining the multiplexing and switching method, with Synchronous Optical Network/STM (SONET/ STM) providing the basis for the physical transmission standard for very high-speed rates. ATM also supports multiple Quality of Service (QoS) classes for differing application requirements on delay and loss performance. Thus, the vision of ATM is that an entire network can be constructed using ATM and ATM Application Layers (AALs) switching and multiplexing principles to support a wide range of all services, such as:

Voice

Packet data (Switched MultiMegabit Data Service (SMDS), Internetworking Protocol (IP), Frame Relay (FR)

Video

Imaging

Circuit emulation

ATM provides bandwidth-on-demand through the use of SVCs, and also support LAN-like access to available bandwidth.

The primary unit in ATM is the cell. ATM standards defined a fixed-size cell with a length of 53 octets (or bytes) comprised of a 5-octet header and a 48-octet payload. The bits in the cells are transmitted over the transmission path in a continuous stream. Cells are mapped into a physical transmission path, such as the North American Digital Signal Level 1 (DS1), DS3, or SONET; International Telecommunications Union—Telecommunications standardization sector (ITU-T) STM standards; and various other local fiber and electrical transmission payloads.

All information is switched and multiplexed in an ATM network in these fixed-length cells. The cell header identifies the destination, cell type, and priority. Fields of the cell header include: the Virtual Path Identifier (VPI) and Virtual Circuit Identifier (VCI) which hold local significance only, and identify the destination. The Generic Flow Control (GFC) field allows a multiplexer to control the rate of an ATM terminal. The Payload Type (PT) indicates whether the cell contains user data, signaling data, or maintenance information. The Cell Loss Priority (CLP) bit indicates the relative priority of the cell. Lower priority cells are discarded before priority cells during congested intervals.

Because of its critical nature, the cell includes a Header Error Check (HEC) which detects and corrects errors in the header. The payload field is passed through the network intact, with no error checking or correction. ATM relies on higher layer protocols to perform error checking and correction on the payload. The fixed cell size simplifies the implementation of ATM switches and multiplexers while providing very high speeds.

When using ATM, longer packets cannot delay shorter packets as in other switched implementations because long packets are chopped up into many cells. This enables ATM to carry Constant Bit Rate (CBR) traffic such as voice and video in conjunction with Variable Bit-Rate (VBR) data traffic, potentially having very long packets within the same network.

Three major concepts in ATM are: the transmission path, the Virtual Path (VP), and, optionally, the Virtual Circuit (VC). These form the basic building blocks of ATM.

These concepts may be analogized in relation to vehicle traffic patterns. These analogies are not intended to be exact, but are merely put forth for illustrative purposes. Think of cells as vehicles, transmission paths as roads, virtual paths as a set of directions, and virtual circuits as a lane discipline on the route defined by the virtual path.

Three transmission paths form the set of roads between three cities: Dallas, Fort Worth, and Houston. There are many interstates, highways, and back roads between the two cities which create many possibilities for different routes, but the primary routes, or virtual paths, are the interstate (VP1) from Dallas to Houston, the highway from Dallas to Fort Worth (VP2), and a back road (VP3) from Fort Worth to Houston. Thus, a car (cell) can travel from Dallas to Houston either over the highway to Fort Worth and then the back road to Houston, or take the direct interstate. Igf the car chooses the interstate (VP1), it has the choice of three lanes: car pool or High Occupancy Vehicle (HOV) (VC1), car lane (VC2), or the truck lane (VC3). These three lanes have speed limits which will cause different amounts of delay in reaching the destination.

In this example, the interstate carries high-speed traffic: tractor trailers, buses, tourists, and business commuters. The highway can carry car and truck traffic, but at a lower speed. The back roads carry locals and traffic avoiding backups on the interstate (spillover traffic), but at an even slower speed.

It should be noted that this example of automotive traffic (cells) has many opportunities for missequencing. Vehicles may decide to pass each other, there can be detours, and road hazards (like stalled cars) may cause some vehicles (cells) to arrive out of sequence or vary in their delay. This is evident in normal transportation when a person always seems to leave on time, but traffic causes some sort of delay. Automotive traffic must employ an Orwellian discipline where everyone follows the traffic routes exactly (unlike any real traffic) in order for the analogy to apply.

The routes also have different quality, including: least driving, (routing) time, most scenic route, least cost (avoids most toll roads), and avoid known busy hours. The same principles apply to ATM. Each of the road types (VPs) and lanes (VCs) can be given a route choice. A commuter from Dallas to Houston in a hurry would first choose the VP1, the interstate. A sightseer would choose the highway to Fort Worth (VP2) to see the old cow town, and then the back road to Houston (VP3) to take in Waco on the way. When commuters enter the interstate toward Houston, they immediately enter the HOV lane (VC1) and speed toward their destination.

A railroad (VC5) may be added to this analogy which runs from Dallas to Houston along the same interstate route (VP1). Assuming no stops between Dallas and Houston, the railroad maintains the same speed from start to finish, with one railroad train running after another according to a fixed schedule. This is like the STM or Time Division Multiplexing (TDM). Imagine there are passengers and cargo going between Dallas and Houston, each having to catch scheduled trains. The arriving passengers and cargo shipments originating at Dallas must wait for the next train. Trains travel regardless of whether there is any passenger or cargo present. If there are too many passengers or cargo for the train's capacity, the excess must wait for the next train.

By studying this analogy, it may observed that the private vehicles (and their passengers) traveling over VC1, VC2, or VC3 have much more flexibility (ATM) than trains (STM) in handling the spontaneous needs of travel. The trains are efficient only when the demand is accurately scheduled and very directed, such as during the rush hour between suburbs and the inner city.

It should be noted that the priorities, or choice, of each VC can vary throughout the day, as can priorities between VPs in ATM. An additional VC can be configured on a moment's notice and assigned a higher priority, as in the case of an ambulance attempting to travel down the median during a traffic jam to get to the scene of an accident.

Turning now to ATM transmission terms, a physical transmission path contains one or more virtual paths (VPs), while each virtual path contains one or more virtual circuits (VCs). Thus, multiple virtual circuits can be trunked on a single virtual path. Switching can be performed on either a transmission path, virtual path, or virtual circuit (i.e., channel) level.

This capability to switch down to a virtual circuit level is similar to the operation of a Private or Public Branch exchange (PBX) or telephone switch in the telephone world. In the PBX/switch, each channel within a trunk group (path) can be switched. Devices which perform VC connections are commonly called VC switches because of this analogy with telephone switches. Transmission networks use a crossconnect, which is basically a space division switch, or effectively an electronic patch panel. ATM devices which connect VPs are commonly often called VP cross-connects by analogy with the transmission network.

At the ATM layer, users are provided a choice of either a VPC or a VCC, defined as follows:

Virtual Path Connections (VPCs) are switched based upon the Virtual Path Identifier (VPI) value only. The users of the VPC may assign the VCC's within that VPI transparently since they follow the same route.

Virtual Circuit Connections (VCCs) are switched upon the combined VPI and Virtual Circuit Identifier (VCI) value.

Both VPIs and VCIs are used to route cells through the network. It should be noted that VPI and VCI values must be unique on a specific transmission path (TP). Thus, each TP between two network devices (such as ATM switches) uses VPIs and VCIs independently.

As will be appreciated by those skilled in the art, communication networks (e.g., ATM) and their operations can be described according to the Open Systems Interconnection (OSI) model which includes seven layers including an application, presentation, session, transport, network, link, and physical layer. The OSI model was developed by the International Organization for Standardization (ISO) and is described in "The Basics Book of OSI and Network Management" by Motorola Codex from Addison-Wesley Publishing Company, Inc., 1993 (First Printing September 1992).

Each layer of the OSI model performs a specific data communications task, a service to and for the layer that precedes it (e.g., the network layer provides a service for the transport layer). The process can be likened to placing a letter in a series of envelopes before it's sent through the postal system. Each succeeding envelope adds another layer of processing or overhead information necessary to process the transaction. Together, all the envelopes help make sure the letter gets to the right address and that the message received is identical to the message sent. Once the entire package is received at its destination, the envelopes are opened one by one until the letter itself emerges exactly as written.

In a data communication transaction, however, each end user is unaware of the envelopes, which perform their functions transparently. Each time that user application data passes downward from one layer to the next layer in the same system more processing information is added. When that information is removed and processed by the peer layer in the other system, it causes various tasks (error correction, flow control, etc.) to be performed.

The ISO has specifically defined all seven layers, which are summarized below in the order in which the data actually flow as they leave the source:

Layer 7, the application layer, provides for a user application (such as getting money from an automatic bank teller machine) to interface with the OSI application layer. That OSI application layer has a corresponding peer layer in the other open system, the bank's host computer.

Layer 6, the presentation layer, makes sure the user information (a request for $50 in cash to be debited from your checking account) is in a format (i.e., syntax or sequence of ones and zeros) the destination open system can understand.

Layer 5, the session layer, provides synchronization control of data between the open systems (i.e., makes sure the bit configurations that pass through layer 5 at the source are the same as those that pass through layer 5 at the destination).

Layer 4, the transport layer, ensures that an end-to-end connection has been established between the two open systems and is often reliable (i.e., layer 4 at the destination "confirms the request for a connection," so to speak, that it has received from layer 4 at the source).

Layer 3, the network layer, provides routing and relaying of data through the network (among other things, at layer 3 on the outbound side an "address" gets slapped on the "envelope" which is then read by layer 3 at the destination).

Layer 2, the data link layer, includes flow control of data as messages pass down through this layer in one open system and up through the peer layer in the other open system.

Layer 1, the physical interface layer, includes the ways in which data communications equipment is connected mechanically and electrically, and the means by which the data move across those physical connections from layer 1 at the source to layer 1 at the destination.

These same layering principals have been applied to ATM communication networks. FIG. 1 shows four Broadband-Integrated Services Digital Network/Asynchronous Transfer Mode (B-ISDN/ATM) layers along with the sublayer structure of the ATM Adaptation Layer (AAL) and PHYsical (PHY) layer. Starting from the bottom, the Physical layer has two sublayers: Transmission Convergence (TC) and Physical Medium (PM). The PM sublayer interfaces with the actual physical medium and passes the recovered bit stream to the TC sublayer. The TC sublayer extracts and inserts ATM cells within the Plesiochronous or Synchronous (PDH or SDH) Time Division Multiplexed (TDM) frame and passes these to and from the ATM layer, respectively. The ATM layer performs multiplexing, switching, and control actions based upon information in the ATM cell header and passes cells to, and accepts cells from, the ATM Adaptation Layer (AAL). The AAL has two sublayers: Segmentation And Reassembly (SAR) and Convergence Sublayer (CS). The CS is further broken down into Common Part (CP) and Service-Specific (SS) components. The AAL passes Protocol Data Units (PDUs) to and accepts PDUs from higher layers. PDUs may be of variable length, or may be of fixed length different from the ATM cell length.

The Physical layer corresponds to layer 1 in the OSI model. The ATM layer and AAL correspond to parts of OSI layer 2, but the address field of the ATM cell header has a network-wide connotation that is like OSI layer 3. The B-ISDN and ATM protocols and interfaces make extensive use of the OSI concepts of layering and sublayer. FIG. 2 illustrates the mapping of the B-ISDN layers to the OSI layers and the sublayers of the PHY, ATM, and ATM Adaptation layers.

The PHY Layer provides for transmission of ATM cells over a physical medium that connects two ATM devices. The PHY Layer is divided into two sublayers: the Physical Medium Dependent (PMD) sublayer and the Transmission Convergence (TC) sublayer. The PMD sublayer provides for the actual transmission of the bits in the ATM cells over the physical medium. The TC sublayer converts between the bit stream clocked to the physical medium and ATM cells of the AAL. On transmit, TC basically maps the cells into the Time Division Multiplexing (TDM) frame format. On reception, it must delineate the individual cells in the received bit stream, either from the TDM frame directly, or via the Header Error Check (HEC) in the ATM cell header. Generating the HEC on transmit and using it to correct and detect errors on receive are also important TC functions. Another important function that TC performs is cell rate decoupling by sending idle cells when the ATM layer has not provided a cell. This is a critical function that allows the ATM layer to operate with a wide range of different speed physical interfaces.

The following describes the Asynchronous Transfer Mode (ATM) Layer. A key concept is the construction of ATM Virtual Paths (VPs) and Virtual Circuits (VCs). The physical layer is composed of three levels: regenerator section, digital section, and transmission path. At the ATM layer, the transmission path is the main area of focus because this is essentially the TDM payload that connects ATM devices. Generically, an ATM device may be either an endpoint or a connecting point for a VP or VC. A Virtual Path Connection (VPC) or a Virtual circuit Connection (VCC) exists only between endpoints. A VP link or a VC link can exist between an endpoint and a connecting point or between connecting points. A VPC or VCC is an ordered list of VP or VC links, respectively, that define a unidirectional flow of ATM cells from one user to one or more other users.

The Virtual Circuit Identifier (VCI) in the cell header identifies a single VC on a particular Virtual Path (VP). Switching at a VC connecting point is done based upon the combination of virtual path and VCI. A VC link is defined as a unidirectional flow of ATM cells with the same VCI between a VC connecting point and either a VC endpoint or another VC connecting point. A VC endpoint also is called an ATM Service Access Point (SAP).

Virtual Paths (VPs) define an aggregate bundle of VCs between VP endpoints. A Virtual Path Identifier (VPI) in the cell header identifies a bundle of one or more VCs. A VP link provides unidirectional transfer of cells with the same VPI between VP endpoints or connecting points. Switching at a VP connecting point is done based upon the VPI. A VP link is defined as a VP between a VP connecting point and either a VP endpoint or another VP connecting point.

The ATM layer requires that cell sequence integrity be preserved. This means that cells are delivered to intermediate connecting points and the destination endpoint in the same order in which they were transmitted.

Several key functions are performed by each sublayer of the ATM layer. The ATM Layer provides many functions, including:

Cell Construction

Cell Reception and Header Validation

Cell Relaying, Forwarding, and Copying Using the VPI/VCI

Cell Multiplexing and Demultiplexing Using the VPI/VCI

Cell Payload Type Discrimination

Interpretation of pre-defined Reserved Header Values

Cell Loss Priority Processing

Support for Multiple QoS Classes

Usage Parameter Control (UPC)

Explicit Forward Congestion Indication (EFCI)

Generic Flow Control

Connection Assignment and Removal

The attributes of the AAL service class are the timing relationships required between the source and destination, whether the bit rate is constant or variable, and whether the connection mode is connection-oriented or connectionless. The four AAL service classes are as follows:

Class A—constant bit-rate (CBR) service with end-to-end timing, connection-oriented Class B—variable bit-rate (VBR) service with end-to-end timing, connection-oriented Class C—variable bit-rate (VBR) service with no timing required, connection-oriented Class D—variable bit-rate (VBR) service with no timing required, connectionless AAL1 through AAL4 were initially defined to directly map to the AAL service classes A through D. AAL5 was conceived by the computer industry in response to perceived complexity and implementation difficulties in the AAL3/4. Initially, AAL5 was named the Simple Efficient Adaptation layer (SEAL).

AAL1 specifies how TDM-type circuits can be emulated over an ATM network. AAL1 supports circuit emulation in one of two modes: the Synchronous Residual Time Stamp (SRTS) or Structured Data Transfer (SDT) method. The SRTS method supports transfer of a DS1 or DS3 digital stream, including timing. SDT supports an octet-structured nxDS0 service.

AAL2 specifies ATM transport of connection-oriented circuit and VBR high bit-rate packetized audio and video. AAL2 may become a key protocol in future ATM implementations requiring support for variable bit-rate audio and video. The second Motion Picture Experts Groups (MPEG) video encoding standard, called MPEG2, can be operated at a variable bit rate.

AAL3 and AAL4 are combined into a single Common Part (CP) AAL3/4 in support of Variable Bit Rate (VBR)

traffic, both connection-oriented or connectionless. Support for connectionless services is provided at the Service Specific Convergence Sublayer (SSCS) level.

The CPCS-PDU for AAL3/4 contains the header which has three components. The 1-octet Common Part Indicator (CPI) indicates the number of counting units (bits or octets) for the Buffer Allocation Size (BASize) field. The sender inserts the same value for the 2-octet Beginning Tag (BTag) and the Ending Tag (ETag) so that the receiver can match them as an additional error check. The 2-octet BASize indicates to the receiver how much buffer space should be reserved to reassemble the CPCS-PDU. A variable-length PAD field of between 0 and 3 octets is inserted in order to make the CPCS=PDU an integral multiple of 32 bits to make end system processing simpler. The trailer also has three fields. The 1-octet Alignment field (AL) simply makes the trailer a full 32 bits to simplify the receiver design. The 1-octet ETag must have the same value as the BTag at the receiver for the CPCS-PDU to be considered valid. The length field encodes the length of the CPCS-PDU field so that the pad portion may be taken out before delivering the payload to the CPCS user.

The SAR-PDU has a 2-octet header and trailer. The header contains three fields. The 2-bit Segment Type (ST) field indicates whether the SAR-PDU is a Beginning Of Message (BOM), a Continuation Of message (COM), an End of Message (EOM), or a Single Segment Message (SSM). The 2-bit Sequence Number (SN) is incremented by the sender and checked by the receiver. The numbering and checking begins when an ST of BOM is received. The 10-bit Multiplex Identification (MID) field allows up to 1024 different CPCS-PDUs to be multiplexed over a single ATM VCC. This is a key function of AAL3/4 since it allows multiple logical connections to be multiplexed over a single VCC. The MID is assigned for a BOM or SSM segment type. The trailer has two fields. The 6-bit Length Indicator (LI) specifies how many of the octets in the SAR-PDU contain CPCS-PDU data. L1 has a value of 44 in BOM and COM segments, and may take on a value less than this in EOM and SSM segments.

The Common Part (CP) AAL5 supports Variable Bit Rate (VBR) traffic, both connection-oriented or connectionless. Support for connectionless or connection-oriented service is provided at the Service Specific Convergence Sublayer (SSCS) level.

The payload may be any integer number of octets in the range of 1 to $2^{16}-1$ (65,535). The Padding field is of a variable length chosen such that the entire CPCS-PDU is an exact multiple of 48 so that it can be directly segmented into cell payloads. The User-to-User (UU) information is conveyed between AAL users transparently. The only current function of the Common Part Indicator (CPI) is to align the trailer to a 64-bit boundary, with other functions for further study. The length field identifies the length of the CPCS-PDU payload so that the PAD can be removed. Since 16 bits are allocated to the length field, the maximum payload length is $2^{16}-1=65,535$ octets. The CRC-32 detects errors in the CPCS-PDU.

The AAL5 SAR-PDU is simply 48 octets from the CPCS-PDU. The only overhead the SAR sublayer makes use of is the Payload Type code points for AAL_indicate. AAL_indicate is zero for all but the last cell in a PDU. A nonzero value of AAL_indicate identifies the last cell of the sequence of cells indicating that reassembly should begin. This was intended to make the reassembly design simpler and make more efficient use of ATM bandwidth.

One of the key limitations in ATM networking is cell loss under congestion. Initial tests with commercial ATM switches have shown that when bursts of traffic occurred causing congestion at the switch, many switches would drop cells making them unpredictable and unreliable for data communications. Unfortunately, this undermines the promise of ATM to be the solution for both telephony traffic, with relatively constant bit rate data sources, and data communications, with variable rate and burst traffic. Because ATM uses statistical multiplexing of small fixed size packets, it was expected it would be efficient in sharing a link's bandwidth between multiple virtual circuits (VCs) that could transport both constant and variable bit rate traffic. It now appears that flow control and the associated congestion control of this mixed traffic is non trivial. While some discussion has occurred on using a rate based flow control, it is still unclear whether it will solve the problems for data communication applications.

The occurrence and the acceptance of cell loss in certain segments of the ATM community reflects the basic mismatch between ATM and applications requiring ATM's switched bandwidth. Aside from video on demand that may require high-bandwidth switching systems, most of today's applications in data communications are delay sensitive, not in the sense of maintaining isochronous delivery of packets or frames but in absolute latency, and intolerant to any loss in data unlike video delivery. Thus, running local area network (LAN) or desktop applications on ATM networks requires ensuring that the delay and correctness of the data can be guaranteed. Unlike traditional multimedia applications that benefit from the multiplexing capability of ATM and are not deleteriously affected by occasional cell loss, these computing applications are best served if they are not disturbed by the presence of other traffic within the switch or switches.

We turn now to an examination of the impact of cell loss on error control, reliability and delay.

Error control in data communications is aggravated in ATM. One of the first areas of impact is reliability. Unlike other networks such as High Performance Parallel Interface (HIPPI) or Fibre Channel, congestion conditions occurring in ATM are a severe source of error, because of the sharing of link bandwidth between different connections (applications). When multiple applications, whose packet traffic patterns are not totally predictable (in terms of a rate measure), share an ATM switch, cell loss is not avoidable. Current ATM switch designs indicate that the cell loss of the switch is far more significant than the normal bit error rate (BER) of the media. Rate based control alone will not eliminate the cell loss that will lead to unreliable data transmission. Unfortunately, large frame transfers common in distributed computing, will suffer more. With a not unusual $10^{-4}$ cell loss probability, a 64 kilobyte (KB) data file transfer has a 11% probability of erroneous transfer. While the industry has an unwritten guideline that a switch be rated so as to provide a cell loss probability of $10^{-9}$, under burst traffic conditions the loss probability can easily exceed that by orders of magnitude.

To effect error control in the case of cell loss, retransmission is required. However, the possibility of repeated retransmissions renders the packet delay nondeterministic. Many distributed data applications require real-time response with bounded delays and therefore this loss of determinism in the delivery is unacceptable. A typical approach to recover from cell loss in delivering a frame of data would be to use ARQ (Automatic Repeat Request) protocols. Here the receiver of the frame will send Acknowledgements (ACKs) to the sender on a per frame basis. If the sender does not receive the proper sequence of ACKs, it will retransmit the unacknowledged frames, possibly using a Go-Back-N algorithm. Since each retransmission is vulnerable to further cell loss in the switch (or sequence of ATM switches), there is no hard bound on the frame delay. This form of indeterminism in latency will be a severe detriment to applications like real-time control (e.g., real time telerobotics), distributed supercomputing, clustered computing, to name but a few.

A simple example will illustrate this point. Consider the remote backup of a data center. A typical write can be of size 64 KB or greater. If the ATM line rate (L) is Optical Connection-3 Synchronous Optical Network (OC-3 SONET) which can accommodate communication rates up to 3 times the current 50 megabytes per second limits to rates of 150 megabytes per second, and the cell loss rate (P) is $10^{-4}$, then the probability that the transmission has an error, assuming uniform cell loss for purely tractability reasons, is shown in (Eq. 1) as:

$$P_e = 1 - (1-P)^{FC} \qquad \text{(Eq. 1)}$$

where F and C are the number of frames and number of cells/frame, respectively. For this example, $P_e$=0.114, a nontrivial probability. If the cell loss increases to $10^{-3}$, then $P_e$ increases to 0.70. The average number (R) of retransmissions required per frame (effectively the traffic increase), assuming a Go-Back-N ARQ, on the frames only is shown in (Eq. 2) as:

$$R = (W/2) P_f / (1-P_f) \qquad \text{(Eq. 2)}$$

where $P_f$ is the error in transmission due to cell loss on a frame basis, and W is the window size of the sliding window protocol used to determine after how many unacknowledged frames a frame is retransmitted. $P_f$ is shown in (Eq. 3) as:

$$P_f = 1 - (1-P)^c \qquad \text{(Eq. 3)}$$

If W=4 frames, the increase in traffic, for P=$10^{-4}$, R=0.74%. However, if P=$10^{-3}$, R=7.68%. It should be noted that the increase in message delay equals R[FC/L+ 2*Propagation Delay]. So over wide-areas, the retransmission delay even for single retransmission is high. Therefore, as the probability of cell loss increases, the traffic overhead and therefore the total message delay increases nonlinearly.

Therefore, a need exists for a way to combat the nondeterminism and unreliability introduced by cell loss in ATM. Such a need can be fulfilled by the use of error correction codes. The present invention provides a solution to this and other problems, and offers other advantages over the prior art.

SUMMARY OF THE INVENTION

The present invention provides an ATM communications networking protocol with improved throughput performance by means of an adaptive forward error correction system and method. The present invention addresses the problem of cell loss by providing adaptive forward error correction (FEC) and more particularly determination whether a feasibility condition is met indicating that FEC can compensate for an expected number of burst errors in a FEC encoded payload. In addition, an alternative feasibility condition is proposed which is based on whether a protocol data unit (PDU) loss probability between connection service application points for a payload is greater than an effective PDU loss probability for the payload with associated FEC PDUs at a given load on the communication network. Also, an optimal overhead parameter for use in performing adaptive FEC in a communication network is described.

In accordance with a first aspect of the invention, an adaptive FEC protocol is provided for use in an ATM communication network. This method is performed by device-implemented steps in a series of distinct processing steps that can be implemented in one or more processors. Whether a feasibility condition is met indicating that FEC can compensate for an expected number of burst errors in a FEC encoded payload is determined. FEC is performed on PDUs within the payload to form a FEC encoded payload only when the feasibility condition is met. Subsequently, the FEC encoded payload along with a corresponding predetermined overhead parameter is sent on a virtual circuit from a source service application point to a destination service application point in the ATM communication network. The predetermined overhead parameter represents a ratio of FEC PDUs to other PDUs in the payload needed to correct burst errors in the FEC encoded payload. The payload along with the corresponding predetermined overhead parameter is received on the virtual circuit at the destination service application point. At that point, FEC is performed to correct burst errors in the FEC encoded payload such that overall PDU loss on the ATM communication network is reduced.

In this protocol, these steps preferably are repeated for each payload to be sent on a virtual circuit from a service application point in the ATM communication network. Also, the determination preferably is accomplished above an asynchronous transfer mode adaptation (AAL) layer (e.g., at an OSI network or transport layer).

The performance of the FEC preferably is accomplished in an AAL. This AAL layer includes a service specific convergence sublayer (SSCS), a common part convergence sublayer (CPCS), and a segmentation and reassembly sublayer (SAR). For an AAL 5 service class, the FEC is accomplished in the SSCS such that the PDUs which are manipulated are frames. For an AAL 3/4 service class, the FEC is accomplished in the SAR such that the PDUs which are manipulated are cells. It will be appreciated by those skilled in the art that the FEC can be accomplished at various AAL sublayers such that service data units (SDUs), frames, or cells may be manipulated during FEC encoding/decoding of the payload.

In the preferred embodiment, the performance of FEC includes determining a quantity of FEC PDUs needed for a predetermined number of PDUs in the payload based on a predetermined overhead parameter. The quantity of FEC PDUs are generated based on a block code error correction coding scheme. These generated FEC PDUs are appended to the PDUs in the payload to form the FEC encoded payload. The predetermined overhead parameter preferably is derived from PDU loss information supplied from either the SAR sublayer of the AAL or an OSI layer above the network layer.

This first aspect of the invention also can be implemented as adaptive FEC sending and receiving units for use in an ATM communication network. The adaptive FEC sending unit includes a feasibility testing mechanism for determining whether a feasibility condition is met indicating that FEC can compensate for an expected number of burst errors in a FEC encoded payload. A processor is operatively coupled to the feasibility testing mechanism to determine an overhead parameter representing a ratio of FEC PDUs needed to correct the expected number of burst errors in the FEC encoded payload to other PDUs in the FEC encoded payload. An FEC device is operatively coupled to the feasibility testing mechanism and the processor which performs FEC on PDUs within the payload based on the overhead parameter to form a FEC encoded payload only when the feasibility condition is met. The adaptive FEC sending unit preferably includes a transmitter which sends the FEC encoded payload along with the overhead parameter on a virtual circuit from a source service application point to a destination service application point in the ATM communication network.

The adaptive FEC receiving unit includes a receiver which receives a FEC encoded payload along with a corresponding overhead parameter on a virtual circuit at a destination service application point from a source service application point in the ATM communication network. A FEC device is operatively coupled to the receiver which performs FEC to correct burst errors in the FEC encoded payload based on the corresponding overhead parameter such that overall PDU loss on the ATM communication network is reduced. This overhead parameter represents a ratio of FEC PDUs to PDUs in the FEC encoded payload needed to correct the expected number of burst errors in the FEC encoded payload.

In accordance with a second aspect of the invention, an alternative adaptive FEC protocol is provided for use in an ATM communication network. This method is performed by device-implemented steps in a series of distinct processing steps that can be implemented in one or more processors. An alternative feasibility condition is determined based on whether a PDU loss probability between connection service application points for a payload is greater than an effective PDU loss probability for the payload with associated FEC PDUs at a given load on the communication network. FEC is performed on PDUs within a payload to form a FEC encoded payload only when the feasibility condition is met.

This second aspect of the invention also can be implemented as adaptive FEC sending and receiving units for use in an ATM communication network. These sending and receiving units operate in a manner similar to those described for the first aspect of the invention except that this alternative feasibility condition is used in place of the first aspect's feasibility condition. Also the determination of the overhead parameter is different due to the use of this alternative feasibility condition.

In accordance with a third aspect of the invention, a method for determining an overhead parameter for adaptive FEC in a communication network which multiplexes connections between multiple nodes is provided. It will be appreciated by those skilled in the art that such a communication network may be a frame relay communication network, an ATM communication network, or other similarly configured communication network. The communication network preferably uses adaptive FEC having an optimal erasure decoding scheme which uses block codes (i.e., an optimal block erasure correction scheme such as a Reed-Solomon coding scheme). This method is performed by device-implemented steps in a series of distinct processing steps that can be implemented in one or more processors. A PDU loss probability between connection service application points for a payload at a time that the payload is to be sent is obtained. A value for a load on the communication network between connection service application points for a payload at a time that the payload is to be sent is obtained. A rate of change of the obtained PDU loss probability with respect to the obtained load on the communication network is determined. Subsequently, an overhead parameter is derived for FEC of a particular payload to be sent as a function of the obtained PDU loss probability, the obtained load, and the determined rate of change.

These and various other features as well as advantages which characterize the present invention will be apparent upon reading of the following detailed description and review of the associated drawings.

BRIEF DESCRIPTION OF THE DRAWINGS

FIG. 1 is prior art block diagram detailing the four B-ISDN/ATM layers along with the sublayer structure of the ATM Adaptation Layer and Physical layer.

FIG. 2 is prior art block diagram mapping of the B-ISDN layers to the OSI layers.

DETAILED DESCRIPTION OF THE PREFERRED EMBODIMENT

Figure 3:
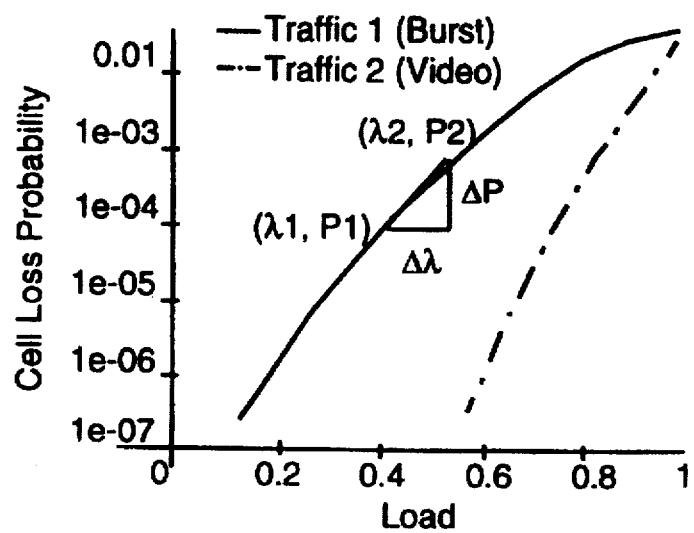
FIG. 3 is a chart showing cell loss probability of an ATM switch as a function of load for two different traffic scenarios.

There are two approaches to combat the unreliability in ATM switches. First, operate the network so as to ensure that no cell loss can occur. Second, provide deterministic error control to recover from congestion-related cell loss.

To avoid congestion in the switch and therefore avoiding cell loss, one can over provision so that all data transfers are executed at the peak bandwidth specified by the user, i.e., the user requests the peak data (burst) rate, based on the minimum latency, as the nominal data rate during connection set up. The switch only allows connections based on peak bandwidth needs and does not ever provision on average data rates. This approach would be employed in the case where the user or the application has highly variable or unpredictable data rates, but where the peak burst rate is known. For instance, among burst sources, both voice and interactive data communications (e.g., Ethernet traffic) exhibit high coefficient of variance (COV) in their instantaneous data rate. Recent observations for remote visualization traffic in the VistaNet gigabit ATM testbed showed unexpectedly high COV (600–26000) whereas typical voice traffic has a COV of 18. In such cases where the variance is not known, it is difficult to specify the average data rate of the source and therefore predict the resulting utilization of the link and the occurrence of congestion in the switch.

For cases where peak rate is not known or the data rate variance is very high, over provisioning will result in low utilization. Furthermore, if bandwidth is not free, this approach is also expensive (the switch bandwidth must be equal to the sum of peak data rates of all communications). The other drawback of the over provisioning approach is that it reduces the multiplexing benefits of ATM when the burst rate exceeds the line rate.

Alternatively, one can avoid congestion by controlling or throttling the offending sources. If the switch employs some form of cell arrival rate measurement such as using a Leaky Bucket scheme, it can be noted when that the cell rate is above a certain specified peak rate. A feedback mechanism can be used to inform and subsequently throttle the data source. Leaky Bucket means for cell pacing and flow control can be used in feedback mode to allow sources to shape their traffic. However, the underlying assumption that sources can shape their traffic by adequate buffering is not true in all cases.

If cell loss from congestion cannot be avoided, then cell loss can be treated as an error in the data transmission and one may use error recovery techniques to recover from these errors.

Error recovery is usually handled by the transport protocol (TP). TP detects as well as recovers from corrupted, out-of-sequence, and duplicated information. Three techniques are commonly used for recovery: forward error correction (FEC), ARQ, and Hybrid schemes.

In FEC, a sufficient number of redundant check bits are transmitted with the payload data to allow the receiver to correct the expected number of errors without retransmission. FEC thus far has been most appropriate for networks with a high bandwidth-delay product.

The well-known ARQ uses enough check bits to detect an error. When an error is detected, ARQ relies on retransmission to reduce erroneous data. As expected, ARQ provides no maximum guarantee on the packet delay.

Hybrid schemes use parity bits for both error detection and correction, but when too many errors are detected, beyond the capability of the error correcting code, relies on ARQ. The trade-off in this approach is between reduced bandwidth and delay.

In the preferred embodiment of the present invention, FEC is used in a hybrid scheme to reduce or eliminate retransmissions and improve delay guarantees. The preferred approach is to use forward error correction (FEC) based on congestion state information so as to maximize the use of the available switch bandwidth. Since FEC can correct erasures caused by cell loss during congestion, the application can use FEC effectively to avoid retransmission. By choosing the appropriate level of coding required, based on the congestion expected (since in most local applications, there will not be a long chain of switches), each data transfer can be successfully executed without retransmission. Because the application can obtain knowledge of the effective bandwidth it utilizes, it also has much better knowledge of the packet delay. Furthermore, if the worst case error level is known, and an adequate amount of error correction is used, the application can be assured of more reliable transfers. This approach not only provides better bounds on the latency for all data transfers but also takes advantage of the bandwidth sharing that ATM provides.

The chosen FEC preferably has the following desired characteristics:

BURST CORRECTION: Errors are in multiples of the cell length and are coincident with cell boundaries;

ERASURE CORRECTION: Most errors are because of congestion that result in cell erasures;

ADAPTABILITY: The channel error statistics and application requirements (for delay, throughput and reliability) vary over a wide range in a short period of time;

LOW REDUNDANCY: The number of errors can be very small and the block size can be very large;

LOW LATENCY: Some application need small encoding/decoding delay;

HIGH THROUGHPUT: Applications need throughput of 1 gigabit per second; and

LOW COMPLEXITY: Implementation should be economical.

FEC codes, as their name suggests, are convolutional or block codes used to correct errors in the message payload without use of retransmission. It will be appreciated by those skilled in the art that either type of error correction coding can be used without departing from the scope and spirit of the present invention. For convolutional encoding the input PDUs of the payload are transformed into convolutional data bit streams which can be transmitted over a communication network. A receiver must estimate what the originally input PDUs were based on a decoding scheme such as maximum likelihood sequence estimation (MLSE) and Viterbi decoding. Such decoding scheme can be both processing and memory intensive and may not be well suited for communication networks operating at high data rate (e.g. OC-3 and beyond). Thus, the following discussion will center on block code error correction coding.

The simplest form of error correction is the use of parity whereby using two parity check bits a single error can be detected and corrected. An extension of this class of using parity checks is the Hamming code. Hamming codes are a first class of linear codes that require matrix operations for encoding and decoding.

There are a couple of other codes that are also used for burst error correction.

Fire Codes are cyclic codes constructed systematically for correcting burst errors. The properties of the Fire code are:

The length of the code $n=LCM(2t-1, q)$

The number of parity check bits is $(m+2t-1)$, for correcting a t-length burst, $t<=m$, where m is the size of the uncoded data block.

Minimum distance of the code=$2t+1$

The generator polynomial $g(X)=(X^{2t-1}+1)p(X)$ where $p(X)$ is irreducible polynomial of degree m, and whose period is q. Although fast decoding circuits can be designed for Fire codes, the error correcting capability is not as good as that of RS.

2-D Product Code error correcting schemes use two systematic error correcting codes for the message data organized as a 2-D array. One code is applied to each row while the other to each column. It can be shown that if the minimum distance of the codes are $d_1$ and $d_2$, then the maximum number of errors that can be corrected is the floor of $\lfloor d_1 d_2 -1)/2 \rfloor$. If burst error correcting codes are used with capabilities of correcting burst lengths of $t_1$ and $t_2$, respectively, then the burst capability of the product code is maximum of $(n_1 t_2, n_2 t_1)$ where $n_1$ and $n_2$ are the dimensions of the encoded 2-D array.

The complexity of the product code is in arranging data in 2-D format for deriving the coding along columns (rows) when the normal mode of coding is along rows (columns). Either software and/or hardware solutions can be employed depending on the data rate that has to be supported on the network.

A special instance of the 2-D code is to use simple EXOR based parities. A sequence of cells are arranged in the 2-D array with EXOR performed on both the rows and columns. One redundant cell is generated per row and column. If the number of columns in the block is $n_1$, then this scheme can recover up to $n_1$ consecutive lost cells, since the parity cell in each row only detects whether a cell is corrupted or lost.

A more popular code for handling random errors is the BCH (Bose Chaudhari Hocquenghem) code, a cyclic code (i.e., a class of codes where an end-around bit shifted version of a valid codeword is also a codeword). BCH codes are attractive because their encoding uses simple linear feedback shift registers (LFSRs), and because it is based on an elegant algebraic structure (Galois fields).

For the preferred embodiment, Reed-Solomon (RS) codes are used. BCH codes are the progenitors of RS codes, the most commonly used codes for burst error correction in disk drives, compact disks, and wireless transmissions. The specific properties of RS codes are:

RS codes are non-binary q-ary codes, where $q=p^m$ where p is a prime, and m any integer.
  The length of the code in q-ary symbols $n=q-1$ (for BCH $n=q^r-1$)
  The number of parity check symbols are 2t, for correcting a t-symbol length burst.
  Length of the uncoded message in q-ary symbols$=n-2t=k$
  Minimum distance of the code$=2t+1$
  The generator polynomial $g(X)=(X+\alpha)(X+\alpha^2)\ldots X+\alpha^{2t})$ As with all BCH codes, RS codes are easy to encode. In the systematic (check bits separate from the information bits) form, the check bits are the remainder of the information bit polynomial modulo $g(X)$. The decoding of the RS code required to locate and correct the errors consists of: calculating the syndromes, related to the error vector of the received word with respect to $g(X)$, and solving 2t (the number of roots of $g(X)$) simultaneous equations. Despite complexities in computing the error location polynomial and the corrections, RS coders and decoders can be implemented efficiently in hardware using LFSRs.

A subclass of RS codes is the RS Erasure (RSE) code which differs from the RS code in that it only corrects erasures. Both RSE and RS coding produce identical codewords, so that the encoder circuit is common to both approaches. However, in erasure coding, the location of the corrupted data is assumed to be known and therefore the decoder for the RSE is simpler.

Because erasure correction requires only corrections and not location (since cells dropped in sequence indicate locations of the burst error), the effective error correction capability of an RSE code is doubled. Thus, an RSE code using t parity check bits will therefore correct a t-length erasure. Usually, this would require solving a set of t linear equations.

To reduce the overall complexity, RSE typically are implemented such that the same hardware can be used for encoding and decoding. The RSE decoding algorithm is simplified because it only deals with erasures.

Turning now to a detailed analysis of RSE, a codeword C which is made up of n m-bit numbers is shown in (Eq. 4):

$$C=(c_{n-1}, c_{n-2}, \ldots, c_0) \qquad \text{(Eq. 4)}$$

This can be represented mathematically by a polynomial of degree n, with the coefficients (symbols) being elements in the field $GF(2^m)$ as shown in (Eq. 5).

$$C(X)=c_{n-1}X^{n-1}+C_{n-2}X^{n-2}+\ldots+c_0 \qquad \text{(Eq. 5)}$$

If k information symbols (k.m bits) and h redundant symbols (h.m bits) are to be transmitted, then the total number of symbols sent must be $n=h+k$. For a valid codeword $n<2^m$. Just like RS, the RSE can correct up to e erasures and detect d additional errors provided that $h \leq d+e$.

A code word C(x) is constructed to be a polynomial of degree n which can be divided by a generator polynomial g(x) of degree h. Using typical RS construction rules the following equation (Eq. 6) is formed.

$$g(x)=(x-a^1)(x-a^2)\ldots(x-a^h) \qquad \text{(Eq. 6)}$$

where, the $a^j$ are one of the $2^m$ elements of $GF(2^m)$.

The information I is made up of k m-bit numbers, as shown in (Eq. 7):

$$I=(i_{k-1}, i_{k-2}, \ldots, i_0) \qquad \text{(Eq. 7)}$$

This can be represented by a polynomial of degree k, as shown in (Eq. 8):

$$I(x)=i_{k-1}X^{k-1}+i_{k-2}X^{k-2}+\ldots+i_0 \qquad \text{(Eq. 8)}$$

If the least significant k symbols of the codeword are set equal to the k information symbols, then the following (Eq. 9) results:

$$C(X)=c_{n-1}X^{n-1}+C_{n-2}X^{n-2}+\ldots+c_kX^k+i_{k-1}X^{k-1}+\ldots+i_0 \qquad \text{(Eq. 9)}$$

It will be appreciated by those skilled in the art that the information can be put in the most significant k symbols, like in RS schemes, without any change in the structure of the codewords. Although the other way simplifies the RSE encoder. The remaining h symbols $c_{n-1}, c_{n-2}, \ldots c_k$ (the parities of the codeword) are chosen to ensure g(x) divides C(x). From (Eq. 6), the following (Eq. 10) results.

$$C(x)=0 \text{ for } x=a^1, x=a^2, \ldots, x=a^h. \qquad \text{(Eq. 10)}$$

Therefore, in order to ensure g(x) divides C(x), the following h equations (Eq. 11) must hold true:

$$0 = c_{n-1}a^{1(n-1)}\ldots+c_ka^{1k}+i_{k-1}a^{1(k-1)}\ldots+i_0a^{1(0)} \qquad \text{(Eq. 11)}$$
$$0 = c_{n-1}a^{2(n-1)}\ldots+c_ka^{2k}+i_{k-1}a^{2(k-1)}\ldots+i_0a^{2(0)}$$
$$\ldots$$
$$0 = c_{n-1}a^{h(n-1)}\ldots+c_ka^{hk}+i_{k-1}a^{h(k-1)}\ldots+i_0a^{h(0)}$$

This is a set of h simultaneous equations, with n terms and h unknowns. Since these codewords are the same as for an RS (except for information position), any h different equations are linearly independent. Thus, the equations can be uniquely solved for the h unknowns ($c_{n-1}, c_{n-2}, \ldots c_k$).

One method of solving simultaneous equations is by matrix manipulation. Here, the above h simultaneous equations are represented by a matrix (Eq. 12) shown below.

$$\begin{matrix}[a^{1(n-1)} & a^{1(n-2)} & a^{1k} & x_1] \\ [a^{2(n-1)} & a^{2(n-2)} & a^{2k} & x_2] \\ [\ldots] \\ [a^{h(n-1)} & a^{h(n-2)} & a^{hk} & x_h]\end{matrix} \qquad \text{(Eq. 12)}$$

$$\text{where, } x_j = i_{k-1}a^{j(k-1)}+i_{k-2}a^{j(k-2)}+\ldots+i_0a^{j(0)}$$

Solving simultaneous equations requires more hardware than the divider employed by a typical RS encoder but, the hardware for solving simultaneous equations is required for decoding erasures. Therefore, to reduce the overall implementation complexity a separate encoder is not typically employed. By using the same hardware for both the encoder and decoder, an advantage in having an exact matching of the encoding and decoding speed is provided.

If the codeword is transmitted and (up to) h of the symbols are lost, it is possible to fill in missing symbols if we know their locations. If the unknowns are represented by variables, then (up to) h simultaneous equations can be constructed and solved, just as when encoding. Thus, the encoding and decoding algorithms are identical, except decoding has unknowns in different positions. Therefore, provided there are fewer than h erasures we can completely reconstruct the information symbols. If fewer than h symbols are lost, the remaining redundant symbols are used to detect up to h-e additional errors, where e is the number of erasures.

The operations of RSE decoding schemes may be better understood after review of the following example.

Let h=3, k=4, n=7 and m=3 and call this a RSE (7,3). This is a 7 symbol block code, with 3 bits per symbol. It can correct up to 3 missing symbols per block and carry four symbols of user information. The information occupies the right 4 symbols and the parities the left 3 symbols. Define the field elements using $a^3=a+1$ as the basis. A field element (symbol) can be represented using either its binary representation or by the powers of a primitive element (a). Thus the eight elements are (Eq. 13):

$$a^0=001\ a^1=010\ a^2=100\ a^3=011$$
$$a^4=110\ a^5=111\ a^6=101\ a^7=000 \quad (Eq.\ 13)$$

A transmitter transmits information (I), where I=(6,5,7,1). Let the unknown code symbols $c_{n-1}=t$, $c_{n-2}=s$ and $c_{n-3}=c_{n-4}=r$. The generator polynomial is defined by $g(x)=(x-1).(x-2).(x-3)$.

From (Eq. 10):

$$C(x)=0\text{ for }x=1, x=2\text{ and }x=3. \quad (Eq.\ 14)$$

From the (Eq. 11):

$$0=t.(6^1)+s.(5^1)+r.(4^1)+6.(3^1)+5.(2^1)+7.(1^1)+1.(0^1)$$
$$0=t.(6^2)+s.(5^2)+r.(4^2)+6.(3^2)+5.(2^2)+7.(1^2)+1.(0^2)$$
$$0=t.(6^3)+s.(5^3)+r.(4^3)+6.(3^3)+5.(2^3)+7.(1^3)+1.(0^3) \quad (Eq.\ 15)$$

(Eq. 14) and ((Eq. 15) resolve to:

$$0=t.(6)+s.(5)+r.(4)+6.(3)+5.(2)+7.(1)+1.(0)$$
$$0=t.(5)+s.(3)+r.(1)+6.(6)+5.(4)+7.(2)+1.(0)$$
$$0=t.(4)+s.(1)+r.(5)+6.(2)+5.(6)+7.(3)+1.(0) \quad (Eq.\ 16)$$

The three unknown symbols are found by applying matrix manipulation techniques to the following matrix (Eq. 17):

$$[6\ 5\ 4\ (2+0+7+1)]$$
$$[5\ 3\ 1\ (5+2+7+1)]$$
$$[4\ 1\ 5\ (1+4+7+1)] \quad (Eq.\ 17)$$

The unique solution for these 3 simultaneous equations is: t=1, s=6 and r=7. So the codeword is C=(1,6,7,6,5,7,1).

The receiver can correct up to 3 erasures in any of the 7 symbols. Let there be 3 erasures (represented by 'f') such that C*=(1,6,7,f,5,f,f). The receiver can generate three simultaneous equations in three unknowns. If $c^*_3=w$, $c^*_1=v$ and $c^*_0=u$, then:

$$0=1.(6)+6.(5)+7.(4)+W.(3)+5.(2)+v.(1)+u.(0)$$
$$0=1.(5)+6.(3)+7.(1)+W.(6)+5.(4)+v.(2)+u.(0)$$
$$0=1.(4)+6.(1)+7.(5)+W.(2)+5.(6)+v.(3)+u.(0) \quad (Eq.\ 18)$$

The three unknown symbols can be found by applying matrix manipulation techniques to the following matrix.

$$[3\ 1\ 0\ (0+4+7+0)]$$
$$[6\ 2\ 0\ (6+2+7+2)]$$
$$[2\ 3\ 0\ (5+0+7+4)] \quad (Eq.\ 19)$$

The unique solution is: w=6, v=7 and u=1. So the rebuilt codeword is C=(1,6,7,6,5,7,1), exactly as sent.

RSE coding has many of the desired characteristics previously outlined including:

BURST CORRECTION

The RSE has the same burst error characteristics as RS. However, because it only tries to correct erasures, it is able to correct up to the number of redundant symbols sent (h) which is twice that of the equivalent error correcting RS. In the example, it could correct up to 9 bits in error (out of 21 bits sent) if they occurred in only three words. However, 4 erasures in 4 different symbols would be uncorrectable, without additional information.

ERASURE CORRECTION

RSE can correct only erasures and detect errors. If all h symbols are used for erasure correction, there are no additional symbols to detect any additional symbol errors. If a word is received in error, erasure correction multiplies the error. Alternatively, applying an inner error detection code to the symbols allows errored symbols to be marked as missing and corrected.

ADAPTABILITY

If m is picked sufficiently large, so $n<2^m$, then, h and n can be varied almost arbitrarily. increasing the block size requires no extra FEC hardware in the encoder or decoder (which contrasts with the RS); however, h increases the hardware quadratically.

LOW REDUNDANCY

The small number of errors expected on future fiber networks, makes it desirable for the code to operate efficiently with very low redundancy. The RSE hardware complexity is independent of the block size (n); so it is well suited to good channels.

LOW LATENCY

For RSE, decoding can begin as soon as k good symbols of the block are received. There is no interleaving. By keeping n small, the impact of block coding on latency can be kept down to acceptable levels.

HIGH THROUGHPUT

RSE is capable of throughput over 1 gigabit per second in 1 micron CMOS.

LOW COMPLEXITY

RSE is implemented using a regular, low complexity systolic chip architecture which has only 3 different cells. This can be contrasted with RS, which requires a much larger number of basic cells.

The traditional use of error recovery using FECs has been in communications where the round trip delay is high and the medium is lossy, as in the case of satellite and wireless media. An article by Ernst W. Biersack, "Performance Evaluation of Forward Error Correction in an ATM Environment", *IEEE Journal On Selected Areas In Communications*, Vol. 11, No. 4, May 1993, pp. 631–640, explores the use of FECs, assuming RSE codes, for lost packet recovery in the context of cell and packet switched networks. The focus of this Biersack article is the loss behavior of an output buffered ATM cell multiplexer under different traffic scenarios.

The Biersack article shows through simulation of traffic from burst and video sources that the loss behavior of an ATM multiplexer or a switch dictates the effectiveness of using FECs. The loss rate differs with respect to the nature of the traffic, i.e., the arrival pattern from the sources, whether it consists of lightly or heavily multiplexed video, burst, or mixed video or burst streams. The multiplexed burst sources show higher cell loss rate at low loads ($>10^{-4}$ for 32 on-off burst sources at offered load of 0.5, as opposed to $<10^{-5}$ for 32 video sources at offered load of 0.9). The more bursty the sources, the more the cell loss rate. However, the article finds through simulation that FEC is not effective for two homogeneous traffic scenarios, but more effective for the case where multiple video (Discrete Cosine Transform encoded VBR with 8:1 variation between maximum and minimum data rates) and burst sources are multiplexed through the switch.

The Biersack article did not have the FEC scheme account for a priori determination of the level of redundancy used, i.e., the overhead or overcode, to compensate for the corresponding increase in load. The preferred embodiment of the present invention includes intelligently determining the overhead based on the projected increase in load on the ATM communication network so that maximization of the use of the available link bandwidth is accomplished. This means that an adaptive FEC approach according to the present invention should be implemented.

The key to optimizing the use of FECs to recover from cell loss is to anticipate the degree of cell loss that will occur with the traffic on the current connection (VC). While over provisioning bandwidth works in general to reduce congestion and cell loss, the preferred embodiment approach is to maximize the bandwidth allocated such that the error control overhead is accounted for and the VC always uses the maximum possible effective bandwidth so as to avoid retransmission. In other words, a forward projection of the total bandwidth required for the payload and the error control overhead is calculated so that all errors that occur can be corrected. To achieve this optimization requires two pieces of information:

The effective cell loss probability P between connection end-points at the time the payload is to be sent, and The increase in the cell loss ΔP because of the current payload.

Typically cell loss probabilities are computed for a switch (FIG. 3) assuming some distribution, usually uniform, of traffic or through simulation. In the end-to-end cell loss case, an examination of the loss behavior between an input of a switch and an output port of the same or another switch within the ATM network cloud is done. The behavior of the cell loss will be similar in most instances, except that it will be dependent on the buffer load on the input and the output paths of all switches in the path, and that the loss behavior can be characterized as the cumulative loss of all cell losses of each input-output port of all switches in the path. However, the general form of the loss behavior is expected to be similar to the loss characteristic of a single switch, as shown in FIG. 3. This is later verified by an example shown later in which the effective cell loss probability is computed after using adaptive FEC.

While it is possible to determine the exact amount of overcoding (i.e., the error control code) required with these two pieces of information, it is based on an idealistic situation. A number of factors conspire to render the real situation less than ideal. For example, consider how P and ΔP are or can be determined.

First, the cell loss probability between end-points is known if the traffic as well as the load on the network is known, since P is a function of λ, the effective offered load on the switch (which is usually assumed to be uniform across ports). If a single switch with known architecture and buffer sizes is interposed between end-points such as in a LAN, then with predictable load λ we can predict P. See for example, the fictitious plot in FIG. 3. It should be noted that the traffic nature also governs the cell loss rate. When more than a single switch is involved between end-points, the effective cell loss, while still exhibiting a monotonic increase with load, will be the statistical aggregate of cell losses in each switch. Unfortunately, since the load on each switch for the relevant input-output port is not uniform, deriving cell loss as a single analytic function of load is neither meaningful nor practical. In such cases, real-time estimation of end-to-end cell loss has to be undertaken as discussed later.

Second, the effective change of cell loss probability ΔP due to the new payload can be computed if P is known analytically as a function of the load. As in the previous case, with a single switch of known parameters, this is possible. Otherwise, real-time estimates of the change of P with load must be relied upon.

Before illustrating how the forward projection of error control overhead is calculated, it should be noted that the load projection of the path assumes a degree of stationarity, i.e., that while the connection FEC coding overhead is being determined, the load on the path is close to the last measured or assessed value. For extremely bursty traffic, where the load fluctuates rapidly, only long-term statistical stationarity can be relied upon. Otherwise, a pessimistic assumption may be made on the increase in the load during encoding time.

The following illustrates how the FEC code overhead is dynamically computed for a simple case where there is a reasonable estimate of P and its dependence on the load available.

Let P be a function of λ, $P=f_1(\lambda)$ where $f_1$ is a monotonically increasing function of λ. $dP/d\lambda$ is positive, while $d^2P/d\lambda^2$ is usually negative because of the saturation behavior of the cell loss at higher loads as shown in FIG. 3. Because of this fact, the modified cell loss for a given load change Δλ can be calculated without underestimating the increase ΔP in cell loss. The key assumptions are in estimating Δλ and dP/dλ.

The difficulty in calculating Δλ is that it depends on the level of coding overhead which in turn depends on the new cell loss probability. This means that the overhead must be calculated from the inequality that the added overhead is sufficient to correct the number of errors that is expected to occur due to increased cell loss probability caused by the error control overhead. Referring to FIG. 3, assume that (λ1, P1) and (λ2, P2) represent the load and cell loss probability without and with the overhead. It is assumed that λ1 represents the estimated load due to the new connection without the use of FEC. It is also assumed that P1 is known.

Assume that RSE coding is used as the means for FEC. Without considering complexity of encoding and decoding, this choice is preferred because of the high error correction efficiency of RSE.

If the block size of the final encoded set of cells is n for an uncoded set of k information cells (i.e., with systematic coding so that the decoder is simplified), then the overhead is $$h = n - k \qquad \text{(Eq. 20)}$$

The corresponding maximum burst size that can be corrected, C, is also h. For erasure correction, the minimum code overhead of h cells is required to correct a burst length of h cells.

In this notation, P1 corresponds to the cell loss rate corresponding to sending an uncoded block of size k. Thus, an h must be found such that the resulting burst B due to cell loss P2 can be corrected by the error correction provided by the h FEC cells. In other words, $$B \leq C \qquad (\text{Eq. 21})$$

The following computation is based on calculating an expected number of burst errors. A more accurate computation is to compute the new effective cell loss due to the use of FEC which is described later. Expected number analysis is relied on here because it is more tractable. The expected number of burst errors due to increased cell loss ΔP is less or equal to the number cells that can be corrected by the error control code. The new loss probability can be approximated as:

$$P2 = P1 + \frac{dP}{d\lambda}\bigg|_{\lambda 1} \Delta\lambda$$

$$= P1 + \frac{dP}{d\lambda}\bigg|_{\lambda 1} \frac{h}{n-h} \lambda 1$$

$$= P1 + \frac{dP}{d\lambda}\bigg|_{\lambda 1} \alpha \lambda 1$$

where, $\alpha, \alpha < 1$, represents the fractional bandwidth overhead due to the h FEC cells (i.e., h=αk).

This relation is pessimistic since the second derivative of P with respect to load is usually negative as indicated earlier. The number of expected cells lost in burst can be estimated for a given cell loss probability, P=P2, and the length of the block is n. This is simply:

$$B = \sum_{i=1}^{n} i \binom{n}{i} P^i (1-P)^{n-i} = nP(1-2P^n) \qquad (\text{Eq. 22})$$

where, n=a number of protocol data units in an encoded form of the payload; and

P=a protocol data unit loss probability between connection service application points at a time that the payload is to be sent; and $$\binom{n}{i}$$

$={}^nC_i$ (combinatorial n choose i).

It should be noted that in (Eq. 22) the summation expression resolves to $nP(1-2P^n)$ after some algebraic manipulations. Such manipulations are well within the skills of one of ordinary skill in the art and therefore are not provided herein.

From (Eq. 21) and (Eq. 22), for RSE encoding we obtain (Eq. 23).

$$p(1-2p^n) \leq \frac{h}{n} = \frac{\alpha}{1+\alpha} \qquad (\text{Eq. 23})$$

It should be noted that if RS is used, then the right hand side (RHS) of (Eq. 22) is halved. If p<<1, and n>1 (as is normally the case), then $(1-2p^n) \approx 1$, n>>1. The slope of the cell loss probability is dP/dλ. When P1 and λ1 are replaced by the more general P and λ, respectively, then (Eq. 23) reduces to:

$$P + \alpha\lambda \frac{dP}{d\lambda} \leq \frac{\alpha}{1+\alpha} \qquad (\text{Eq. 24})$$

The quadratic relation of (Eq. 24) results in two solutions, only one of which is viable depending on the values of $$\left( \frac{dP}{d\lambda} \lambda + P \right).$$

The solution for the fractional overhead α is given by (Eq. 25).

$$\alpha \leq \qquad (\text{Eq. 25})$$

$$\frac{-\left(\frac{dP}{d\lambda}\lambda + P - 1\right) - \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) - \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

$$\text{if}\left(\frac{dP}{d\lambda}\lambda + P\right) < 1$$

$$\alpha \leq \frac{-\left(\frac{dP}{d\lambda}\lambda + P - 1\right) + \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) + \frac{\sqrt{\left(\frac{dP}{d\lambda}\lambda + P - 1\right)^2 - 4P\frac{P}{d\lambda}\lambda}}{2\frac{dP}{d\lambda}\lambda}$$

$$\text{if}\left(\frac{dP}{d\lambda}\lambda + P\right) \geq 1$$

where,

λ=communication network load at a time that the payload is to be sent;

P=protocol data unit loss probability between connection service application points at a time that the payload is to be sent; and $$\frac{dP}{d\lambda}$$

=a rate of change of P with respect to λ.

The derivation of (Eq. 25) from (Eq. 24) is as follows so that a solution for α is provided. The quadratic relation of (Eq. 24) results in two solutions:

$$\alpha \leq \qquad (\text{Eq. 26})$$

$$\frac{-\left(\frac{dP}{d\lambda}\lambda + P - 1\right) \pm \sqrt{\left(\frac{dP}{d\lambda}\lambda + P - 1\right)^2 - 4P\frac{dP}{d\lambda}\lambda}}{2\frac{dP}{d\lambda}\lambda} =$$

-continued $$-\left(\frac{1}{2} - \frac{(1-P)}{2\frac{dP}{d\lambda}\lambda}\right) + \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

Two conditions must be satisfied for any of these solutions to be feasible. First, the term under the square root must be positive. This results in the condition of (Eq. 27).

$$\left(\lambda\frac{dP}{d\lambda} - P\right)^2 + 1 \geq 2\left(\lambda\frac{dP}{d\lambda} + P\right) \quad \text{(Eq. 27)}$$

Second, since $\alpha \geq 0$, then $$-\left(\frac{dP}{d\lambda}\lambda + P - 1\right) \pm \sqrt{\left(\frac{dP}{d\lambda}\lambda + P - 1\right)^2 - 4P\frac{dP}{d\lambda}\lambda} \geq 0 \quad \text{(Eq. 28)}$$

Because P, $$\frac{dP}{d\lambda},$$

and $\lambda$ are positive (EQ. 28) yields, $$-\left(\frac{dP}{d\lambda}\lambda + P - 1\right) \geq \sqrt{\left(\frac{dP}{d\lambda}\lambda + P - 1\right)^2 - 4P\frac{dP}{d\lambda}\lambda} \quad \text{(Eq. 29)}$$

provided (Eq. 27) holds true, and the left hand side (LHS) of (Eq. 29) is positive. The LHS of (Eq. 29) is positive if, $$\left(\frac{dP}{d\lambda}\lambda + P\right) < 1 \quad \text{(Eq. 30)}$$

Thus, if the inequality of (Eq. 30) is true, the valid solution is the smaller value of $\alpha$ which is:

$$\alpha \leq \quad \text{(Eq. 31)}$$

$$\frac{-\left(\frac{dP}{d\lambda}\lambda + P - 1\right) - \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) - \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

When the inequality of (Eq. 30) is not true, the solution to $\alpha$ is:

$$\alpha \leq \quad \text{(Eq. 32)}$$

$$\frac{-\left(\frac{dP}{d\lambda}\lambda + P - 1\right) + \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) + \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

It will be appreciated by those skilled in the art that if the term under the square root is negative (i.e., no solution for $\alpha$ exists) in (Eq. 25), then FEC would not compensate for the expected burst errors, but would instead aggravate the loss probability. Therefore, to determine if FEC application is feasible, an inequality constraint on the rate of cell loss increase with respect to the current cell loss probability shown in (Eq. 27) must be satisfied. This is termed the critical condition or the feasibility condition for FEC. The feasibility condition is dependent only on the current operating point (P, $\lambda$) and the nature of the cell loss behavior of the switch, $dP/d\lambda$.

(Eq. 25) and (Eq. 26) together constitute the design conditions for determining the feasibility and the application of adaptive FEC for an ATM connection in the preferred embodiment of the present invention.

The computation procedure presented in the preferred embodiment above estimates the average burst size in cells, and then proposes to add enough FEC erasure cells to correct the estimated burst. A more fair comparison is to ask is what is the new cell loss probability. To answer this the probability that the number of cells dropped due to congestion exceeds the number that can be corrected by the code must be estimated. Recall that although the FEC code is added to be equal or greater than the expected number of cells erased in a block, statistically, the cell loss exceeding the correctable number cannot be avoided. The approach in using adaptive FEC is to reduce the possibility within a block so that the number of cells dropped within a block size due to a burst can be corrected, through adequate error correction.

In an alternative preferred embodiment of the present invention the effective cell loss is calculated when using adaptive FEC. To do this the probability, $P_{\mathit{eff}}$, that the number cells erased exceeds the number that can be corrected is calculated. Since the maximum burst error that can be corrected is h in the case of erasure decoding, $$P_{\mathit{eff}} = \frac{1}{n}\left[1 - \sum_{i=1}^{h} i\binom{n}{i} q^i (1-q)^{n-i}\right] \quad \text{(Eq. 33)}$$

where, $$q = P2 = P + \alpha\lambda\frac{dP}{d\lambda} \quad \text{(the new loss probability due to the FEC overhead);}$$

h=$\alpha$k; and $\alpha$ is defined by (Eq. 25). Since $\alpha$ is not necessarily an integer, a ceiling function is used to compute the nearest h such that h=$\lceil \alpha k \rceil$, h $\geq$ 1

While the condition for feasibility of adaptive FEC was based on calculating the expected number of burst errors that had to be corrected, a more accurate condition is that the new or effective loss probability be less than the loss probability without FEC for the same load. Otherwise, using FEC has no advantage. This statistical condition can be written as:

$$\frac{P_{\mathit{eff}}}{\lambda_{\mathit{eff}}} < \frac{P_{\mathit{eff}}}{\lambda} < \frac{P}{\lambda} \quad \text{(Eq. 34)}$$

Where the effective load is $\lambda(1+\alpha)$, and using (Eq. 33), this condition can be simplified to:

$$\sum_{i=1}^{h} i\binom{n}{i} q^i (1-q)^{n-i} > 1 - kP \quad \text{(Eq. 35)}$$

A few trade-offs are indicated by (Eq. 35). If the block size n is constant: then LHS increases as h increases and therefore $\alpha$ increases. But an increasing h, also decreases k, thereby increasing the RHS. Also, q increases with h, but (1–q) decreases. So there is nonlinear constraint in increasing the FEC overhead h.

Since computing h based on (Eq. 35) is cumbersome (i.e., requires an iterative solution approach), the approximation based on the expected error burst size in (Eq. 25) may be preferred.

Returning once again to the description of the preferred embodiment of the present invention, a specification for a new FEC protocol for the ATM environment is provided. This FEC protocol is termed forward adaptive correction of errors (FACE) and it supports an adaptive FEC method to be used to optimize bandwidth usage in ATM links.

FACE is an adaptive FEC that defines the use of adapting the level of error correction and error correction overhead for optimizing the bandwidth usage of a shared ATM link. FACE is expected to be used in controlling error control of end-to-end data transfer where peer processes above the network level collaborate to recover from congestion related cell loss. FACE dictates the level of error correction required to recover from cell loss while minimizing retransmission. In its simplest form, each end user (on a host workstation) uses a special ATM adapter that provides the adaptive FEC option. It is assumed that the ATM adapter provides FEC support, possibly, in terms of hardware if the ATM line rates so require, at the Service Specific Convergence Layer (SSCS) of the ATM Adaptation Layer (AAL).

The current ATM Forum specifications (UNI 3.1) as well as the forthcoming one (UNI 4.0) do not address error control at the cell level, either in AAL3/4 or AAL5. In AAL3/4, a 10-bit cyclic redundant code (CRC) is used for providing a means for error detection, but no error correction is provided. Error control is only specified for the 5-byte cell header using a byte-sized HEC field in all ATM cells.

Recently however, some need has been shown for using FEC at the AAL so that packet transmission at higher layers will see effectively lower data losses. In the current draft specification under consideration, an FEC-SSCS function is defined that will support the use of FEC for all SAR PDUs. The FEC-SSCS is located on top of the Common Part Convergence Sublayer (CPCS) of AAL 5 and AAL 3/4. In this specification, it is envisioned that the FEC-SSCS provide the capabilities to transfer the AAL-SDU from the source AAL-service application point (SAP) to the destination AAL-SAP through the ATM communication network. When the CPCS-SDU received by the destination CPCS entity detects the error (both cell loss and bit error), the FEC-SSCS tries to recover the original data sent from the source CPCS entity using an apriori specified FEC algorithm.

Figure 4:
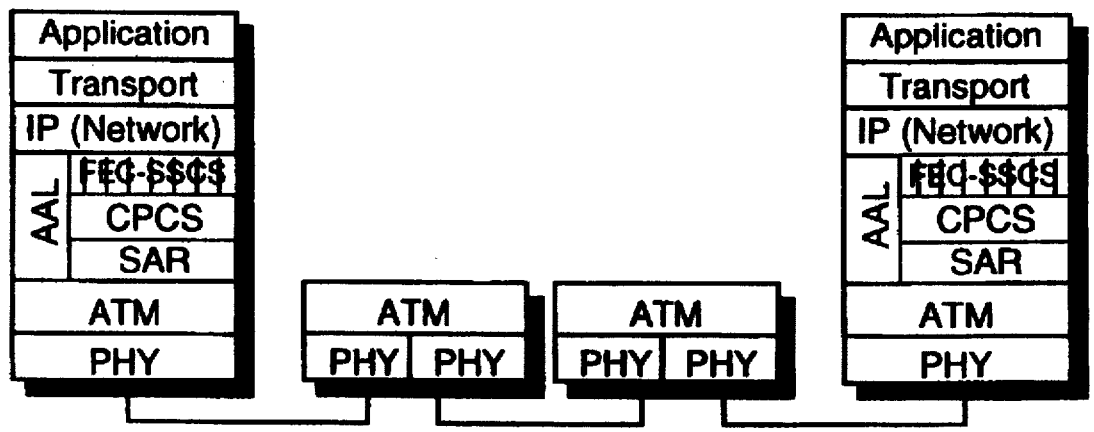
FIG. 4 is a block diagram of a preferred embodiment protocol structure in which adaptive FEC capability is provided for use in AAL 3/4 in accordance with the present invention.
Figure 5:
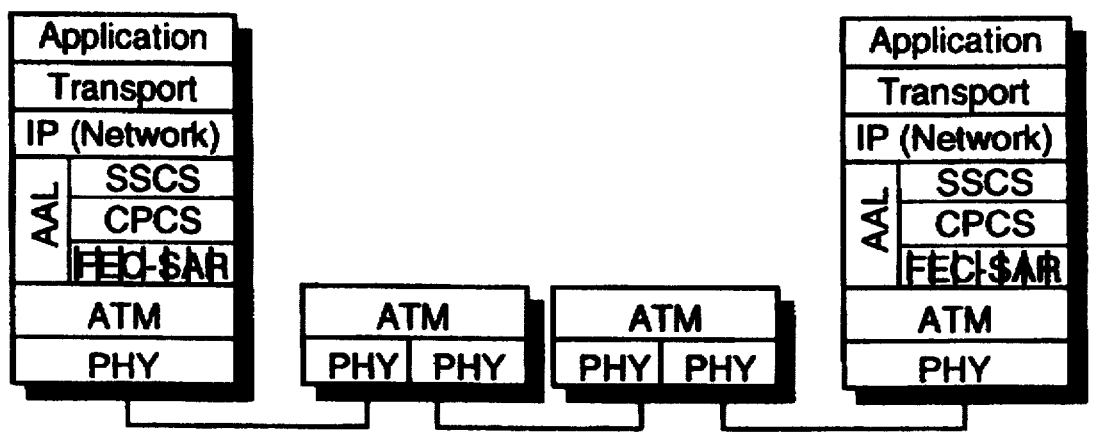
FIG. 5 is a block diagram of a preferred embodiment protocol structure in which adaptive FEC capability is provided for use in AAL 5 in accordance with the present invention.

While the draft FEC-SSCS specification defines some of the parameters that would be controlled by FACE, the key aspect of FACE is in providing the mechanism for adapting the level of error correction. At present it would appear necessary for FACE to obtain cell loss information from either the ATM SAR (see FIGS. 4 and 5) or the Transport layer, so that it can determine what loss rate it should expect when application data (in frames or cells) are sent on the ATM link. FIGS. 4 and 5 are block diagrams of preferred embodiment protocol structures in which adaptive FEC capability is provided for use in AAL 3/4 and AAL 5, respectively.

Figure 6:
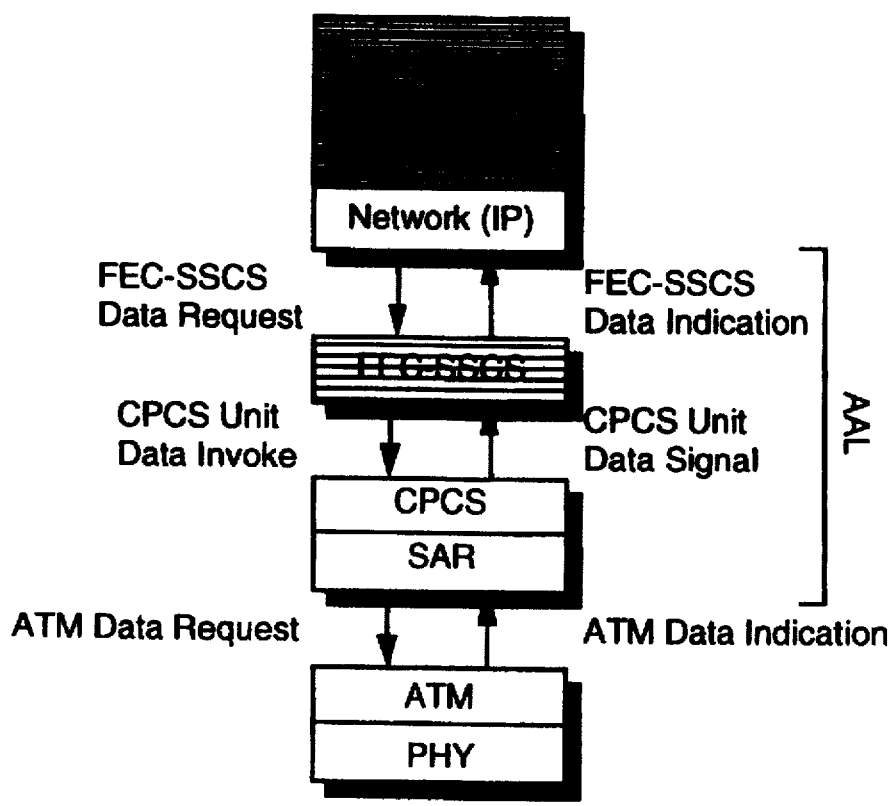
FIG. 6 is a block diagram of a preferred embodiment FEC support protocol model and relative position of FACE in accordance with the present invention.

FIG. 6 shows a FEC support protocol model and relative position of FACE in the OSI/ATM layer model. As shown in FIG. 6, the protocol is expected to reside above the ATM layer while communicating with the ATM AAL. Most likely, FACE will be co-located with the Transport layer. The primary function of the FACE protocol is to dynamically compute the correction overhead is, i.e., decide on the relative overhead (e.g., h FEC cells for a variable number, k of payload cells in the case of AAL3/4) to create the FEC-coded block. While the specific nature of communication with the Network layer (IP) is not detailed, it is assumed that FACE will communicate directly with the AAL layer, such as the FEC-SSCS component that would support the coding and decoding of FEC.

The basic steps of the FACE protocol are:

Determine whether under the current operating conditions, and on indication of congestion from CPCS that congestion was experienced FEC should be applied, and knowledge of cell loss and cell loss rate, FEC would be feasible. The condition described in (Eq. 27) should be used to test feasibility. This test for feasibility preferably is conducted at connection setup time and during the lifetime of the connection if the connection was set up without use of FEC.

If the condition for feasibility fails, do not apply FEC. Return to the previous step where cell loss or congestion is monitored either in the Upper Layer or through information from the AAL.

If the feasibility condition passes, then signal to the AAL (for example, communicating to the FEC-SSCS component of the AAL) that FEC should be used with the overhead parameter $\alpha$ defined as in (Eq. 25). It will be appreciated by those skilled in the art that the value of $\alpha$ does not depend on whether the FEC is applied: at the cell level (as possibly in AAL3/4), in an interleaved format where Lk payload or data cells use Lh FEC cells for L-way interleaving as opposed to k payload cells using h FEC cells, or at the frame level where the data cells and FEC cells are encapsulated in a service data unit (SDU) (as in the case of AAL5). From $\alpha$, determine the ratio of FEC cells to the number of payload cells. h can be kept fixed (by using standard hardware that always generates h FEC cells for a variable number k of payload cells). Therefore, $k=h/\alpha$, and the encoded block of cells is of length $n=h(1+1/\alpha)$.

During the life of the connection, FACE monitors the data loss levels using two possible means. The first means is a direct congestion information from the AAL level if the AAL supports the FEC-SSCS which continually provides information on the level of cell loss by monitoring the number of symbols found missing in a sequence. The second means determines the information indirectly at the Transport level where each segment is monitored for the fraction of segments in error using error detection employed at that level. The preferred approach is the indication of cell from the AAL since this would provide a higher granularity of information in a much shorter time.

FACE maintains parameters per connection or ATM VC (virtual circuit). Thus, although multiple VCs will share the same link, each VC will be associated with its own set of parameters that are maintained by FACE. The AAL layer supporting function, such as the FEC-SSCS, uses these parameters to code and decode every symbol block a connection at a time.

Since current specifications in FEC-SSCS do not allow explicit identification of different connection by distinct identifiers. It has been assumed that different connections require different FEC-SSCS SDU structure, each with a different set of FEC parameters. However, it may be possible to multiplex different connection data into a single FEC-SSCS connection depend on the upper layer's decision. This implementation of this possibility will be based on whether each of the connections which are multiplexed suffer very different losses. If the loss level of the connection are very different, then they will be carried by different FEC-SSCS SDUs with distinct FEC parameters.

The FEC parameters, especially the level of overhead and the sizes of the symbol, are established between the source and destination SAPs through some form of signaling, either using existing Q.2931 ATM Forum standard, or some form of in-band signaling as established by the FEC support at the AAL level. If the latter is used then, then the parameters to set up the FEC parameters will be dictated by a new/ evolving standard. Otherwise, the FEC-based connection establishment will set the necessary parameters that include relative FEC overhead, symbol length, and degree of interleaving.

In brief, there are three areas of application of FACE protocol. For example, an adapter that provides improved cell loss and security would be extremely attractive to users. Also, routers that have to interface ATM networks such as an ATM interface card, can be configured with FACE to provide an additional lossless guarantee feature. Also, an ATM switch may elect to be responsible for continuously monitoring the local and wide-area traffic by VCs, so that it can inform the end-user or a particular VC what the expected cell loss rate and the rate of change of cell loss to expect. This would result in a more accurate determination especially for local-area traffic.

It will be appreciated by those skilled in the art that several other data applications that would benefit from FACE. Some potential data applications include network attached storage, as well as local and backbone networks, cluster supercomputing (the HIPPI market).

Figure 7:
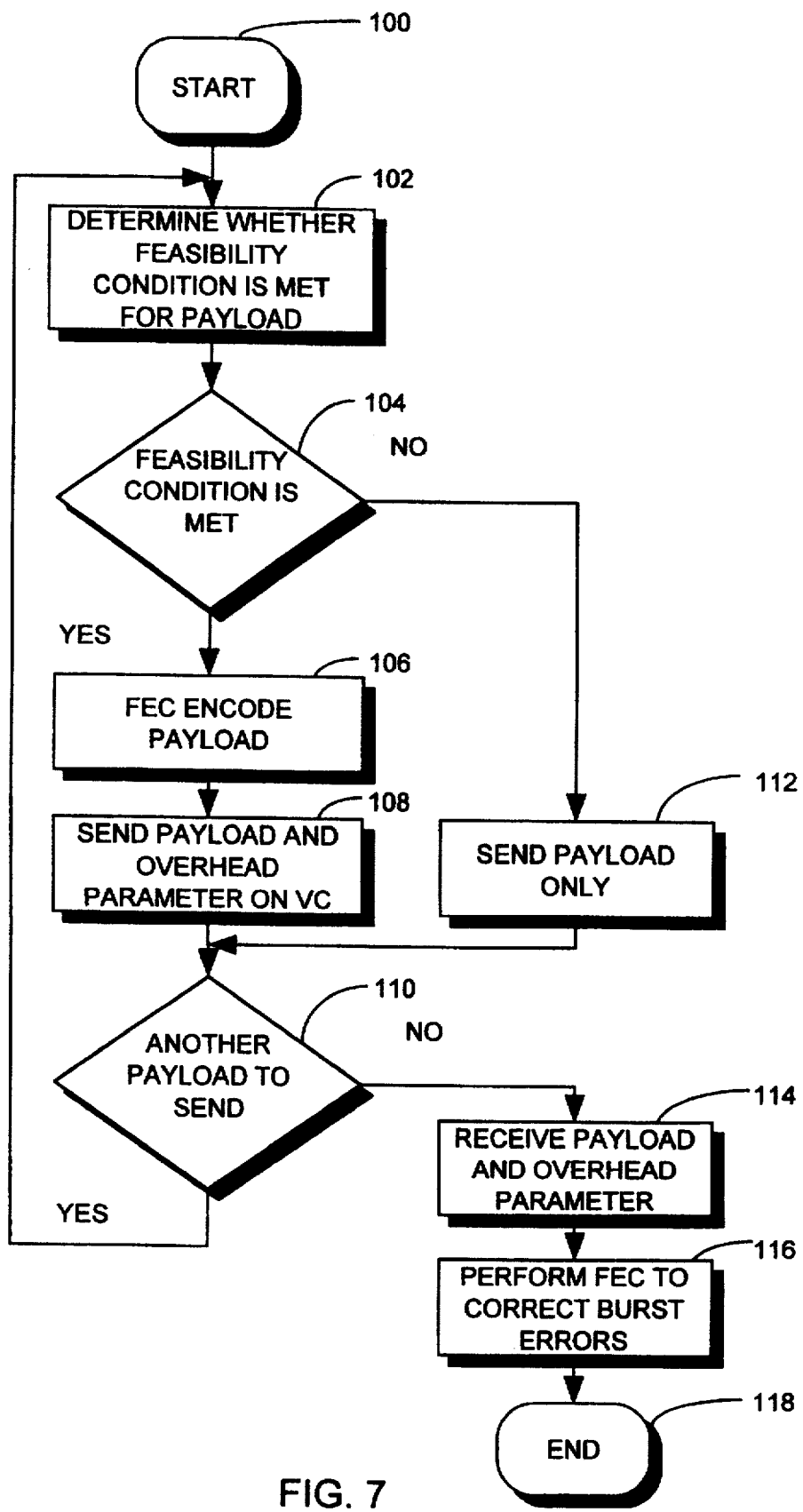
FIG. 7 is a flowchart of the preferred embodiment adaptive FEC protocol in accordance with the present invention.

The present invention can be summarized in reference to FIG. 7 which is a flowchart of the preferred embodiment adaptive FEC protocol for use in an ATM communication network. This method is performed by device-implemented steps in a series of distinct processing steps 100–118 that can be implemented in one or more processors. A feasibility condition is determined 102 based on whether FEC can compensate for an expected number of burst errors in a FEC encoded payload. The expected number of burst errors can be calculated as described in (Eq. 22). The feasibility condition can be calculated as described in (Eq. 27). FEC is performed 106 on PDUs within the payload to form a FEC encoded payload only when the feasibility condition is met 104. The error correction scheme preferably is either a convolutional code error correction scheme or a block code error correction scheme (e.g., a Reed-Solomon (RS) block coding scheme or the optimal erasure decoding scheme Reed-Solomon Erasure (RSE)). Subsequently, the FEC encoded payload along with a corresponding predetermined overhead parameter is sent 108 on a virtual circuit from a source service application point to a destination service application point in the ATM communication network. When the feasibility condition is not met 104, only the payload is sent 112 on the virtual circuit. The predetermined overhead parameter represents a ratio of FEC PDUs to PDUs in the payload needed to correct burst errors in the FEC encoded payload. This overhead parameter may be calculated as described in (Eq. 25). The payload along with the corresponding predetermined overhead parameter is received 114 on the virtual circuit at the destination service application point (for the feasibility condition being met). At that point, FEC is performed 116 to correct burst errors in the FEC encoded payload such that overall PDU loss on the ATM communication network is reduced.

In this protocol, these steps preferably are repeated 110 for each payload to be sent on a virtual circuit from a service application point in the ATM communication network. Also, the determination 102 preferably is accomplished above an asynchronous transfer mode adaptation (AAL) layer (e.g., at an OSI network or transport layer).

The performance of the FEC 108 preferably is accomplished in an AAL. This AAL layer includes a service specific convergence sublayer (SSCS), a common part convergence sublayer (CPCS), and a segmentation and reassembly sublayer (SAR). For an AAL 5 service class, the FEC is accomplished in the SSCS such that the PDUs which are manipulated are frames. For an AAL 3/4 service class, the FEC is accomplished in the SAR such that the PDUs which are manipulated are cells. It will be appreciated by those skilled in the art that the FEC can be accomplished at various AAL sublayers such that service data units (SDUs), frames, or cells may be manipulated during FEC encoding/ decoding of the payload.

In the preferred embodiment, the performance of FEC 106 includes determining a quantity of FEC PDUs needed for a predetermined number of PDUs in the payload based on a predetermined overhead parameter. The quantity of FEC PDUs are generated based on a block code error correction coding scheme. These generated FEC PDUs are appended to the PDUs in the payload to form the FEC encoded payload. The predetermined overhead parameter preferably is derived from PDU loss information supplied from either the SAR sublayer of the AAL or an OSI layer above the network layer.

Figure 8:
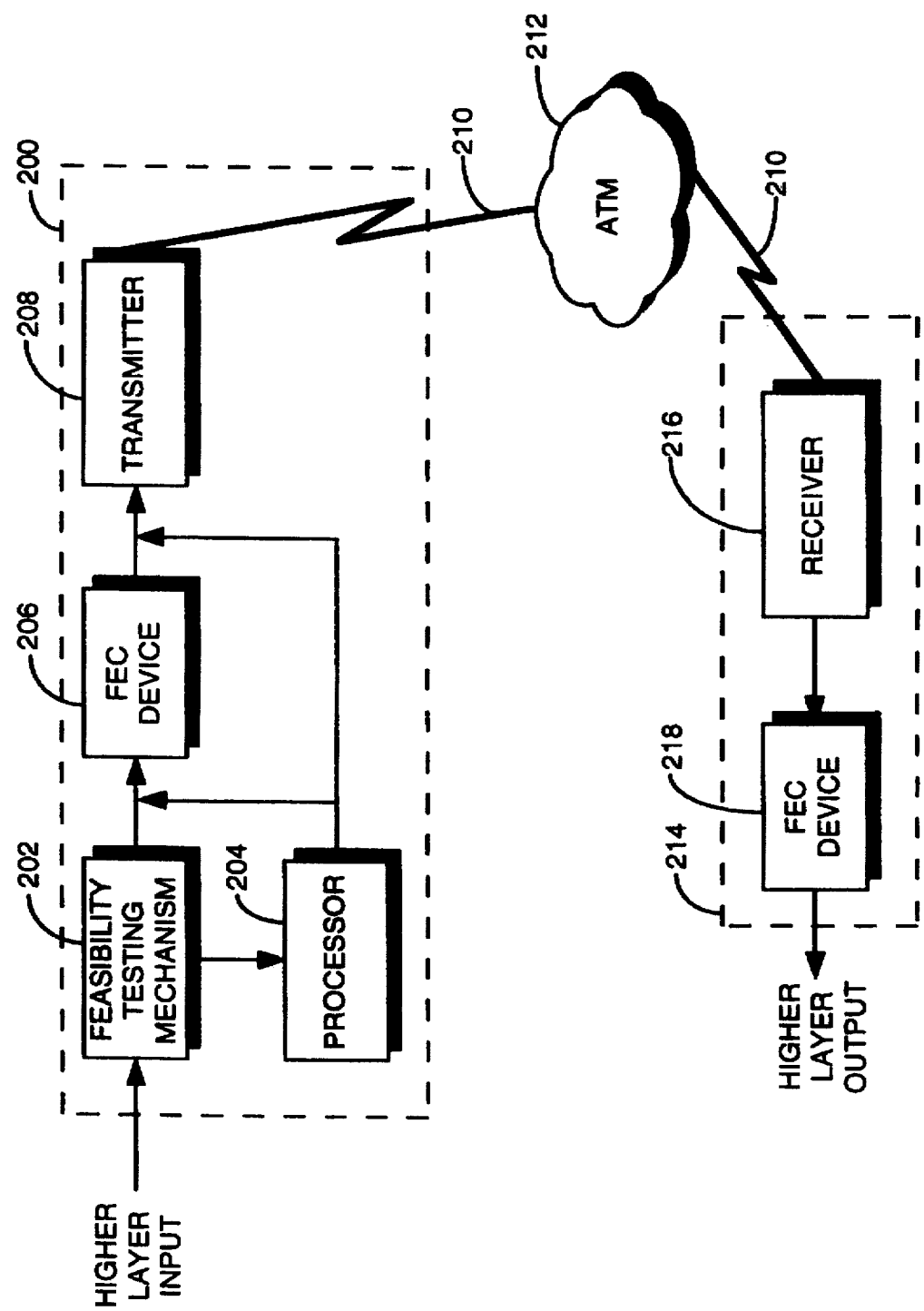
FIG. 8 is a system block diagram showing adaptive FEC sending and receiving units, respectively, for use in an ATM communication network in accordance with the present invention.

This preferred embodiment of the present invention also can be implemented as adaptive FEC sending and receiving units for use in an ATM communication network, as shown in FIG. 8. The adaptive FEC sending unit 200 includes a feasibility testing mechanism 202 for determining a feasibility condition based on whether FEC can compensate for an expected number of burst errors in a FEC encoded payload. A processor 204 is operatively coupled to the feasibility testing mechanism 202 to determine an overhead parameter representing a ratio of FEC PDUs needed to correct the expected number of burst errors in the FEC encoded payload to other PDUs in the FEC encoded payload. An FEC device 206 is operatively coupled to the feasibility testing mechanism 202 and the processor 204 which performs FEC on PDUs within the payload based on the overhead parameter to form a FEC encoded payload only when the feasibility condition is met. The adaptive FEC sending unit 200 preferably includes a transmitter 208 which sends the FEC encoded payload along with the overhead parameter on a virtual circuit 210 from a source service application point to a destination service application point in the ATM communication network 212. The various components of the sending unit 200 preferably operate in accordance with the steps described above in reference to the preferred embodiment adaptive FEC protocol (e.g., α is calculated with (Eq. 25)).

The adaptive FEC receiving unit 214 includes a receiver 216 which receives a FEC encoded payload along with a corresponding overhead parameter on a virtual circuit 210 at a destination service application point from a source service application point in the ATM communication network 212. A FEC device 218 is operatively coupled to the receiver 216 which performs FEC to correct burst errors in the FEC encoded payload based on the corresponding overhead parameter such that overall PDU loss on the ATM communication network 212 is reduced. This overhead parameter represents a ratio of FEC PDUs needed to correct the expected number of burst errors in the FEC encoded payload to other PDUs in the FEC encoded payload. The various components of the receiving unit 214 preferably operate in accordance with the steps described above in reference to the preferred embodiment adaptive FEC protocol.

An alternative adaptive FEC protocol is provided for use in an ATM communication network. This alternative protocol also can be described in reference to FIG. 7. This method is performed by device-implemented steps in a series of distinct processing steps 100–118 that can be implemented in one or more processors. An alternative feasibility condition is determined 102 based on whether a PDU loss probability between connection service application points for a payload is greater than an effective PDU loss probability for the payload with associated FEC PDUs at a given load on the communication network. FEC is performed 106 on PDUs within a payload to form a FEC encoded payload, only when the feasibility condition is met 104.

This alternative preferred embodiment of the present invention also can be implemented as adaptive FEC sending and receiving units for use in an ATM communication network. These sending and receiving units operate is a manner similar to those described in reference to FIG. 8 for the preferred embodiment, except that this alternative feasibility condition is used in place of the preferred embodiment's feasibility condition. Also the determination of the overhead parameter is different due to the use of this alternative feasibility condition.

Figure 9:
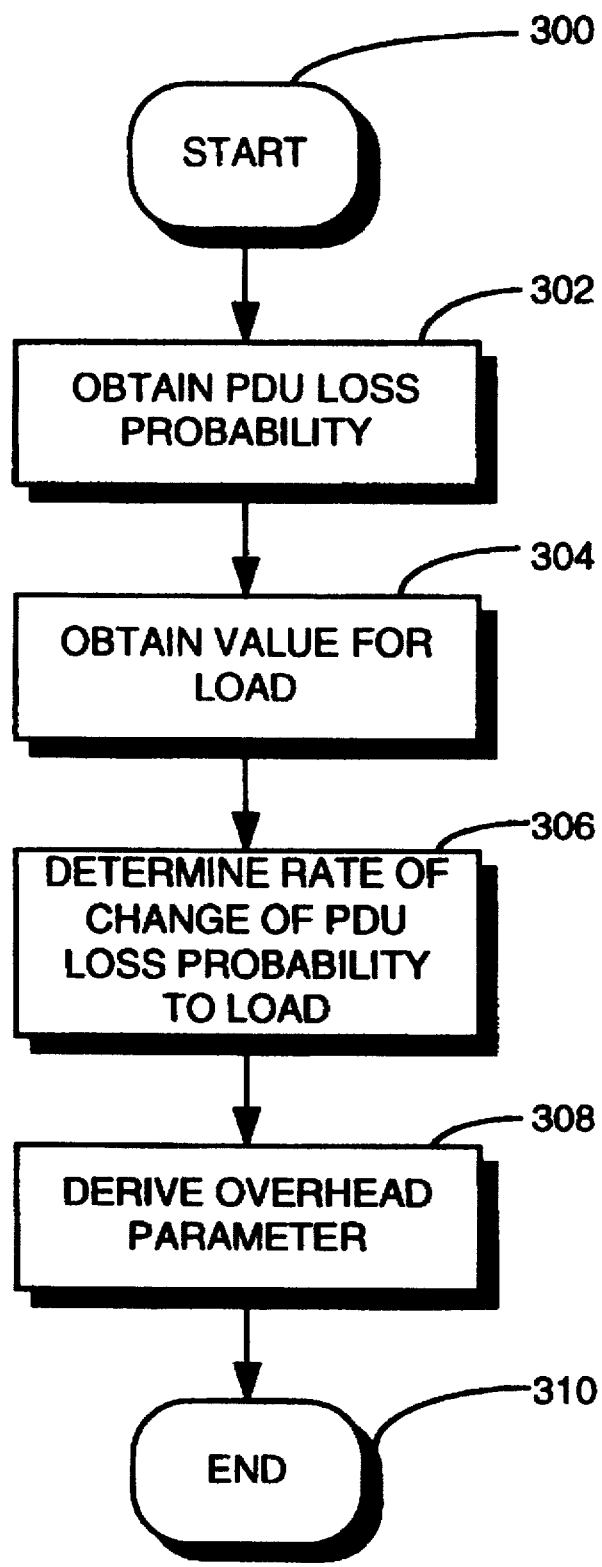
FIG. 9 is a flowchart of the preferred embodiment method for determining an overhead parameter for adaptive FEC in a communication network which multiplexes connections between multiple nodes in accordance with the present invention.

Shown in FIG. 9 is a method for determining an overhead parameter for adaptive FEC in a communication network which multiplexes connections between multiple nodes is provided. It will be appreciated by those skilled in the art that such a communication network may be a frame relay communication network, an ATM communication network, or other similarly configured communication network. The communication network preferably uses adaptive FEC having an optimal erasure decoding scheme which uses block codes (i.e., an optimal block erasure correction scheme such as a Reed-Solomon decoding scheme). This method is performed by device-implemented steps 300–310 in a series of distinct processing steps that can be implemented in one or more processors. A PDU loss probability between connection service application points for a payload at a time that the payload is to be sent is obtained 302. A value for a load on the communication network between connection service application points for a payload at a time that the payload is to be sent is obtained 304. A rate of change of the obtained PDU loss probability with respect to the obtained load on the communication network is determined 306. Subsequently, an overhead parameter is derived 308 for FEC of a particular payload to be sent as a function of the obtained PDU loss probability, the obtained load, and the determined rate of change. The forward error correction scheme preferably is an optimal erasure coding scheme such as Reed-Solomon block decoding. The overhead parameter may be derived from (Eq. 25).

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed. For example, feasibility condition and overhead parameter ($\alpha$) could be derived from a metric which includes function that is only related to those shown in the equations rather than explicitly the metrics defined herein without departing from the spirit and scope of the invention as claimed.

What is claimed is:

1. An adaptive forward error correction protocol for use in an asynchronous transfer mode communication network, comprising the steps of:

(a) determining whether a feasibility condition is met based on indicating that forward error correction can compensate for an expected number of burst errors in a forward error correction encoded payload, (b) performing forward error correction coding on protocol data units within a payload to form the forward error correction encoded payload only when the feasibility condition is met.

2. The method of claim 1 wherein the determining step is accomplished above an asynchronous transfer mode adaptation layer.

3. The method of claim 1 wherein the protocol data units are selected from the group consisting of service data units, cells, and frames.

4. The method of claim 1 wherein the expected number of burst errors for a forward error correction encoded payload is derived from a metric comprising a related function (B) defined as follows:

$$B = \sum_{i=1}^{n} i \binom{n}{i} P^i(1-P)^{n-i} = nP(1-2P^n)$$

where, n=a number of protocol data units in an encoded form of the payload; and

P=a protocol data unit loss probability between connection service application points at a time that the payload is to be sent.

5. The method of claim 1 further comprising the step of initiating the determining and performing steps for each payload to be sent on a virtual circuit from a service application point in the asynchronous transfer mode communication network.

6. The method of claim 5 further comprising the step of sending the forward error correction encoded payload along with a corresponding predetermined overhead parameter on a virtual circuit from a source service application point to a destination service application point in the asynchronous transfer mode communication network, the predetermined overhead parameter representing a ratio of forward error correction protocol data units needed to correct the expected number of burst errors in the forward error correction encoded payload to other protocol data units in the forward error correction encoded payload.

7. The method of claim 6 further comprising the step of receiving the forward error correction encoded payload along with the corresponding predetermined overhead parameter on the virtual circuit at the destination service application point in the asynchronous transfer mode communication network, performing forward error correction to correct burst errors in the forward error correction encoded payload such that overall protocol data unit loss on the asynchronous transfer mode communication network is reduced.

8. The method of claim 1 wherein the performing step is accomplished in an asynchronous transfer mode adaptation layer, the asynchronous transfer mode adaptation layer having a service specific convergence sublayer, a common part convergence sublayer, and a segmentation and reassembly sublayer.

9. The method of claim 8 wherein the performing step is accomplished in the service specific convergence sublayer such that the protocol data units comprise frames for an asynchronous transfer mode adaptation layer 5 service class.

10. The method of claim 8 wherein the performing step is accomplished in the segmentation and reassembly sublayer such that the protocol data units comprise cells for an asynchronous transfer mode adaptation layer 3/4 service class.

11. The method of claim 1 wherein the performing step comprises using an error correction scheme selected from the group consisting of a convolutional code error correction scheme and a block code error correction scheme.

12. The method of claim 11 wherein the block code error correction scheme is a Reed-Solomon (RS) coding scheme.

13. The method of claim 5 wherein the feasibility condition is derived from an inequality comprising related functions defined as follows:

$$\left(\lambda \frac{dP}{d\lambda} - P\right)^2 + 1 \geq 2\left(\lambda \frac{dP}{d\lambda} + P\right)$$

where, $\lambda$=a communication network load at a time that the payload is to be sent;

P=protocol data unit loss probability between connection service application points at a time that the payload is to be sent; and $$\frac{dP}{d\lambda}$$

=a rate of change of P with respect to $\lambda$.

14. The method of claim 11 wherein the performing step comprises determining a quantity of forward error correction protocol data units needed for a predetermined number of protocol data units in the payload based on a predetermined overhead parameter, generating the quantity of forward error correction protocol data units based on the block code error correction coding scheme, appending the generated forward error correction protocol data units to the protocol data units in the payload to form the forward error correction encoded payload.

15. The method of claim 14 wherein the predetermined overhead parameter is derived from protocol data unit loss information from a layer selected from the group consisting of a segmentation and reassembly sublayer of an asynchronous transfer mode adaptation layer and an Open Systems Interconnection (OSI) layer above the network layer.

16. The method of claim 14 wherein the predetermined overhead parameter is derived from a metric comprising a related function ($\alpha$) defined as follows:

$\alpha \leq$ $$\frac{-\left(\frac{dP}{d\lambda}\lambda + P - 1\right) - \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) - \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

$$\text{if}\left(\frac{dP}{d\lambda}\lambda + P\right) < 1$$

$\alpha \leq$ $$\frac{-\left(\frac{dP}{d\lambda}\lambda + P - 1\right) + \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) + \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

$$\text{if}\left(\frac{dP}{d\lambda}\lambda + P\right) \geq 1$$

where, $\lambda$=communication network load at a time that the payload is to be sent;

P=protocol data unit loss probability between connection service application points at a time that the payload is to be sent; and $$\frac{dP}{d\lambda}$$

=a rate of change of P with respect to $\lambda$.

17. An adaptive forward error correction protocol for use in an asynchronous transfer mode communication network, comprising the steps of:

(a) determining whether a feasibility condition is met based on indicating that forward error correction can compensate for an expected number of burst errors in a forward error correction encoded payload;

(b) performing forward error correction on protocol data units within the payload to form a forward error correction encoded payload only when the feasibility condition is met;

(c) sending the forward error correction encoded payload along with a corresponding predetermined overhead parameter on a virtual circuit from a source service application point to a destination service application point in the asynchronous transfer mode communication network, the predetermined overhead parameter representing a ratio of forward error correction protocol data units needed to correct the expected number of burst errors in the forward error correction encoded payload to other protocol data units in the forward error correction encoded payload; and (d) receiving the forward error correction encoded payload along with the corresponding predetermined overhead parameter on the virtual circuit at the destination service application point in the asynchronous transfer mode communication network, performing forward error correction to correct burst errors in the forward error correction encoded payload such that overall protocol data unit loss on the asynchronous transfer mode communication network is reduced.

18. The method of claim 17 further comprising the step of initiating the determining and performing steps for each payload to be sent on a virtual circuit from a service application point in the asynchronous transfer mode communication network.

19. The method of claim 17 wherein the determining step is accomplished above an asynchronous transfer mode adaptation layer.

20. The method of claim 17 wherein the performing step is accomplished in an asynchronous transfer mode adaptation layer, the asynchronous transfer mode adaptation layer having a service specific convergence sublayer, a common part convergence sublayer, and a segmentation and reassembly sublayer, the forward error correction being accomplished in the service specific convergence sublayer such that the protocol data units comprise frames for an asynchronous transfer mode adaptation layer 5 service class.

21. The method of claim 17 wherein the performing step is accomplished in an asynchronous transfer mode adaptation layer, the asynchronous transfer mode adaptation layer having a service specific convergence sublayer, a common part convergence sublayer, and a segmentation and reassembly sublayer, the forward error correction being accomplished in the segmentation and reassembly sublayer such that the protocol data units comprise cells for an asynchronous transfer mode adaptation layer 3/4 service class.

22. The method of claim 17 wherein the expected number of burst errors for a forward error correction encoded payload is derived from a metric comprising a related function (B) defined as follows:

$$B = \sum_{i=1}^{n} i \binom{n}{i} P^i (1-P)^{n-i} = nP(1-2P^m)$$

where, n = a number of protocol data units in an encoded form of the payload; and P = a protocol data unit loss probability between connection service application points at a time that the payload is to be sent.

23. The method of claim 17 wherein the performing step comprises determining a quantity of optimal block erasure correction protocol data units needed for a predetermined number of protocol data units in the payload based on the corresponding predetermined overhead parameter, generating the quantity of forward error correction protocol data units based on an optimal block erasure correction scheme, appending the generated forward error correction protocol data units to the protocol data units in the payload to form the forward error correction encoded payload, the corresponding predetermined overhead parameter being derived from a metric comprising a related function ($\alpha$) defined as follows:

$$\alpha \leq \frac{-\left(\frac{dP}{d\lambda}\lambda + P - 1\right) - \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) - \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

if $\left(\frac{dP}{d\lambda}\lambda + P\right) < 1$ $$\alpha \leq \frac{-\left(\frac{dP}{d\lambda}\lambda + P - 1\right) + \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) + \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

if $\left(\frac{dP}{d\lambda}\lambda + P\right) \geq 1$ where, $\lambda$ = a communication network load at a time that the payload is to be sent;

P = protocol data unit loss probability between connection service application points at a time that the payload is to be sent; and $$\frac{dP}{d\lambda}$$

= a rate of change of P with respect to $\lambda$.

24. The method of claim 17 wherein the feasibility condition is based on an optimal block erasure correction scheme, the feasibility condition being derived from an inequality comprising related functions defined as follows:

$$\left(\lambda\frac{dP}{d\lambda} - P\right)^2 + 1 \geq 2\left(\lambda\frac{dP}{d\lambda} + P\right)$$

where, $\lambda$ = a communication network load at a time that the payload is to be sent;

P = protocol data unit loss probability between connection service application points at a time that the payload is to be sent; and $$\frac{dP}{d\lambda}$$

= a rate of change of P with respect to $\lambda$.

25. The method of claim 24 wherein the optimal block erasure correction scheme comprises a Reed-Solomon decoding scheme.

26. An adaptive forward error correction sending unit for use in an asynchronous transfer mode communication network, comprising:

(a) feasibility means for determining whether a feasibility condition is met indicating that forward error correction can compensate for an expected number of burst errors in a forward error correction encoded payload;

(b) determining means, operatively coupled to the feasibility means, for determining an overhead parameter representing a ratio of forward error correction protocol data units to protocol data units in the forward error correction encoded payload needed to correct the expected number of burst errors in the forward error correction encoded payload; and (c) forward error correction means, operatively coupled to the feasibility means and the determining means, for performing forward error correction coding on protocol data units within the payload based on the overhead parameter to form a forward error correction encoded payload only when the feasibility condition is met.

27. The adaptive forward error correction sending unit of claim 26 further comprising transmission means, operatively coupled to the determining means and the forward error correction means, for sending the forward error correction encoded payload along with the overhead parameter on a virtual circuit from a source service application point to a destination service application point in the asynchronous transfer mode communication network.

28. The adaptive forward error correction sending unit of claim 26 wherein the forward error correction means comprises means for determining a quantity of optimal block erasure correction protocol data units needed for a predetermined number of protocol data units in the payload based on the overhead parameter, generating the quantity of forward error correction protocol data units based on the optimal block erasure correction scheme, and appending the generated forward error correction protocol data units to the protocol data units in the payload to form the forward error correction encoded payload, the predetermined overhead parameter being derived from a metric comprising a related function ($\alpha$) defined as follows:

$$\alpha \leq \frac{-\left(\frac{dP}{d\lambda}\lambda + P - 1\right) - \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) - \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

$$\text{if}\left(\frac{dP}{d\lambda}\lambda + P\right) < 1$$

$$\alpha \leq \frac{-\left(\frac{dP}{d\lambda}\lambda + P - 1\right) + \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) + \frac{\sqrt{\left(\frac{dP}{d\lambda}\lambda + P - 1\right)^2 - 4P\frac{P}{d\lambda}\lambda}}{2\frac{dP}{d\lambda}\lambda}$$

$$\text{if}\left(\frac{dP}{d\lambda}\lambda + P\right) \geq 1$$

where, $\lambda$=a communication network load at a time that the payload is to be sent;

P=protocol data unit loss probability between connection service application points at a time that the payload is to be sent; and $\frac{dP}{d\lambda}$ =a rate of change of P with respect to $\lambda$.

29. The adaptive forward error correction sending unit of claim 26 wherein determining means derives the overhead parameter from protocol data unit loss information from a layer selected from the group consisting of a segmentation and reassembly sublayer of an asynchronous transfer mode adaptation layer and an Open Systems Interconnection (OSI) layer above the network layer.

30. The adaptive forward error correction sending unit of claim 26 wherein the feasibility condition is based on an optimal block erasure correction scheme, the feasibility condition being derived from an inequality comprising related functions defined as follows:

$$\left(\lambda\frac{dP}{d\lambda} - P\right)^2 + 1 \geq 2\left(\lambda\frac{dP}{d\lambda} + P\right)$$

where, $\lambda$=a communication network load at a time that the payload is to be sent;

P=protocol data unit loss probability between connection service application points at a time that the payload is to be sent; and $\frac{dP}{d\lambda}$ =a rate of change of P with respect to $\lambda$.

31. The adaptive forward error correction sending unit of claim 30 wherein the optimal block erasure correction scheme comprises a Reed-Solomon decoding scheme.

32. The adaptive forward error correction sending unit of claim 26 wherein the forward error correction means operates in an asynchronous transfer mode adaptation layer, the asynchronous transfer mode adaptation layer having a service specific convergence sublayer, a common part convergence sublayer, and a segmentation and reassembly sublayer.

33. The adaptive forward error correction sending unit of claim 32 wherein the forward error correction means operates in the service specific convergence sublayer such that the protocol data units comprise frames for an asynchronous transfer mode adaptation layer 5 service class.

34. The adaptive forward error correction sending unit of claim 32 wherein the forward error correction means operates in the segmentation and reassembly sublayer such that the protocol data units comprise cells for an asynchronous transfer mode adaptation layer 3/4 service class.

35. An adaptive forward error correction receiving unit for use in an asynchronous transfer mode communication network, comprising:

(a) receiving means for receiving a forward error correction encoded payload along with a corresponding overhead parameter on a virtual circuit at a destination service application point from a source service application point in the asynchronous transfer mode communication network;

(b) forward error correction means, operatively coupled to the receiving means, for performing forward error correction to correct burst errors in the forward error correction encoded payload based on the corresponding overhead parameter such that overall protocol data unit loss on the asynchronous transfer mode communication network is reduced, the overhead parameter representing a ratio of forward error correction protocol data units needed to correct the expected number of burst errors in the forward error correction encoded payload to other protocol data units in the forward error correction encoded payload.

36. The adaptive forward error correction receiving unit of claim 35 wherein the forward error correction means operates in an asynchronous transfer mode adaptation layer, the asynchronous transfer mode adaptation layer having a service specific convergence sublayer, a common part convergence sublayer, and a segmentation and reassembly sublayer.

37. The adaptive forward error correction receiving unit of claim 35 wherein the forward error correction means operates in the service specific convergence sublayer such that the protocol data units comprise frames for an asynchronous transfer mode adaptation layer 5 service class.

38. The adaptive forward error correction receiving unit of claim 35 wherein the forward error correction means operates in the segmentation and reassembly sublayer such that the protocol data units comprise cells for an asynchronous transfer mode adaptation layer 3/4 service class.

39. An adaptive forward error correction protocol for use in an asynchronous transfer mode communication network, comprising the steps of:
(a) determining whether a feasibility condition is met indicating that a protocol data unit loss probability between connection service application points for a payload is greater than an effective protocol data unit loss probability for the payload with associated forward error correction protocol data units at a given load on the communication network; and
(b) performing forward error correction coding on protocol data units within a payload to form a forward error correction encoded payload only when the feasibility condition is met.

40. An adaptive forward error correction sending unit for use in an asynchronous transfer mode communication network, comprising:
(a) feasibility means for determining whether a feasibility condition is met indicating that a protocol data unit loss probability between connection service application points for a payload is greater than an effective protocol data unit loss probability for the payload with associated forward error correction protocol data units at a given load on the communication network;
(b) determining means, operatively coupled to the feasibility means, for determining an overhead parameter representing a ratio of forward error correction protocol data units to other protocol data units in a forward error correction encoded payload needed to correct burst errors; and
(c) forward error correction means, operatively coupled to the feasibility means and the determining means, for performing forward error correction coding on protocol data units within the payload based on the overhead parameter to form a forward error correction encoded payload only when the feasibility condition is met.

41. The adaptive forward error correction sending unit of claim 40 further comprising transmission means, operatively coupled to the determining means and the forward error correction means, for sending the forward error correction encoded payload along with the overhead parameter on a virtual circuit from a source service application point to a destination service application point in the asynchronous transfer mode communication network.

42. An adaptive forward error correction receiving unit for use in an asynchronous transfer mode communication network, comprising:
(a) receiving means for receiving a forward error correction encoded payload along with a corresponding overhead parameter on the virtual circuit at a destination service application point from a source service application point in the asynchronous transfer mode communication network;
(b) forward error correction means, operatively coupled to the receiving means, for performing forward error correction to correct burst errors in the payload based on the corresponding overhead parameter such that overall protocol data unit loss on the asynchronous transfer mode communication network is reduced, the overhead parameter representing a ratio of forward error correction protocol data units to other protocol data units in the forward error correction encoded payload needed to correct burst errors.

43. A device-implemented method for determining an overhead parameter for adaptive forward error correction in a communication network which multiplexes connections between multiple nodes, comprising the steps of:
(a) obtaining a protocol data unit loss probability between connection service application points for a payload at a time that the payload is to be sent;
(b) obtaining a load on the communication network between connection service application points for a payload at a time that the payload is to be sent;
(c) determining a rate of change of the obtained protocol data unit loss probability with respect to the obtained load on the communication network; and
(d) deriving an overhead parameter for forward error correction of a particular payload to be sent as a function of the obtained protocol data unit loss probability, the obtained load, and the determined rate of change.

44. The method of claim 43 wherein the communication network is selected from the group consisting of a frame relay communication network and an asynchronous transfer mode communication network.

45. The method of claim 43 wherein the communication network uses adaptive forward error correction having an optimal block erasure correction scheme such that deriving step derives the overhead parameter from a metric at least comprising a related function ($\alpha$) defined as follows:

$$\alpha \leq \frac{-\left(\frac{dP}{d\lambda}\lambda + P - 1\right) - \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) - \frac{\sqrt{\left(\frac{dP}{d\lambda}\lambda + P - 1\right)^2 - 4P\frac{dP}{d\lambda}\lambda}}{2\frac{dP}{d\lambda}\lambda}$$

$$\text{if}\left(\frac{dP}{d\lambda}\lambda + P\right) < 1$$

$$\alpha \leq \frac{-\left(\frac{dP}{d\lambda}\lambda + P - 1\right) + \sqrt{\left(\frac{dP}{d\lambda}\lambda + P - 1\right)^2 - 4P\frac{dP}{d\lambda}\lambda}}{2\frac{dP}{d\lambda}\lambda} =$$

$$-\left(\frac{1}{2} - \frac{(1-P)}{2\frac{dP}{d\lambda}\lambda}\right) + \frac{\sqrt{\left(\frac{dP}{d\lambda}\lambda + P - 1\right)^2 - 4P\frac{P}{d\lambda}\lambda}}{2\frac{dP}{d\lambda}\lambda}$$

$$\text{if}\left(\frac{dP}{d\lambda}\lambda + P\right) \geq 1$$

where, $\lambda$=communication network load at a time that the payload is to be sent;

P=protocol data unit loss probability between connection service application points at a time that the payload is to be sent; and $\frac{dP}{d\lambda}$ =a rate of change of P with respect to $\lambda$.

46. The method of claim 45 wherein the optimal block erasure correction scheme comprises a Reed-Solomon decoding scheme.

* * * * *